US010254350B2

(12) United States Patent
Beaston

(10) Patent No.: US 10,254,350 B2
(45) Date of Patent: Apr. 9, 2019

(54) WARRANTY TRACKER FOR A BATTERY PACK

(71) Applicant: Powin Energy Corporation, Tualatin, OR (US)

(72) Inventor: Virgil Lee Beaston, Tualatin, OR (US)

(73) Assignee: Powin Energy Corporation, Tualatin, OR (US)

( * ) Notice: Subject to any disclaimer, the term of this patent is extended or adjusted under 35 U.S.C. 154(b) by 357 days.

(21) Appl. No.: 14/819,779

(22) Filed: Aug. 6, 2015

(65) Prior Publication Data

US 2017/0038433 A1 Feb. 9, 2017

(51) Int. Cl.
*G01R 31/36* (2006.01)
*G01K 13/00* (2006.01)
*G06Q 30/00* (2012.01)

(52) U.S. Cl.
CPC ......... *G01R 31/3658* (2013.01); *G01K 13/00* (2013.01); *G01R 31/3606* (2013.01); *G01R 31/3651* (2013.01); *G06Q 30/012* (2013.01)

(58) Field of Classification Search
CPC ............ G01R 31/3658; G01R 31/3606; G01R 31/3651; G01K 13/00; G06Q 30/012
(Continued)

(56) References Cited

U.S. PATENT DOCUMENTS 5,047,961 A * 9/1991 Simonsen .......... G01R 31/3624
320/150
5,790,961 A 8/1998 Ingram et al.
(Continued)

FOREIGN PATENT DOCUMENTS

CN 1319189 A 10/2001
CN 1367565 A 9/2002
(Continued)

OTHER PUBLICATIONS

U.S. Appl. No. 15/604,329, "World-Wide Web of Networked, Smart, Scalable, Plug & Play Battery Packs Having a Battery Pack Operating System, and Applications Thereof," to Beaston, filed May 24, 2017.
(Continued)

*Primary Examiner* — Tan T. Nguyen
(74) *Attorney, Agent, or Firm* — Sterne, Kessler, Goldstein & Fox P.L.L.C.

(57) ABSTRACT

Systems and methods are disclosed for a warranty tracker embedded in a battery pack. In an embodiment, the warranty tracker may include a memory device and a warranty controller. The warranty controller may receive an electric current measurement indicating a rate of charge or discharge of the battery pack from a device that is external to the battery pack. A warranty value may then be calculated using the received electric current measurement and added to a stored cumulative warranty value. The memory device may store the cumulative warranty value, which may be used to evaluate warranty conditions. In various embodiments, the warranty tracker may also include a temperature sensor and/or a voltage sensor. The warranty controller may then use received temperature and/or voltage measurements in the calculation of the warranty value. In an embodiment, the stored cumulative warranty value may be used to determine expiration of a warranty.

12 Claims, 15 Drawing Sheets

(58) Field of Classification Search
USPC .......................................................... 702/63
See application file for complete search history.

(56) References Cited

U.S. PATENT DOCUMENTS

| | | | |
|---|---|---|---|
| 5,825,155 A | | 10/1998 | Ito et al. |
| 5,952,815 A | | 9/1999 | Rouillard et al. |
| 6,051,976 A | * | 4/2000 | Bertness ............ G01R 31/3631 |
| | | | 324/426 |
| 6,060,864 A | | 5/2000 | Ito et al. |
| 6,172,481 B1 | | 1/2001 | Curtiss |
| 6,184,656 B1 | * | 2/2001 | Karunasiri ............ B60L 3/0046 |
| | | | 180/65.8 |
| 7,420,293 B2 | | 9/2008 | Donnelly et al. |
| 7,497,285 B1 | | 3/2009 | Radev |
| 7,583,053 B2 | | 9/2009 | Kamohara |
| 8,111,035 B2 | | 2/2012 | Rosenstock |
| 9,168,836 B2 | | 10/2015 | Jacobsen |
| 9,331,497 B2 | | 5/2016 | Beaston |
| 9,647,463 B2 | | 5/2017 | Brandl et al. |
| 9,847,654 B2 | | 12/2017 | Beaston |
| 9,882,401 B2 | | 1/2018 | Beaston |
| 9,923,247 B2 | | 3/2018 | Beaston |
| 2002/0193955 A1 | * | 12/2002 | Bertness ............ G01R 31/3627 |
| | | | 702/63 |
| 2003/0001579 A1 | | 1/2003 | Bertness |
| 2004/0130292 A1 | | 7/2004 | Buchanan et al. |
| 2004/0189248 A1 | | 9/2004 | Boskovitch et al. |
| 2005/0024016 A1 | | 2/2005 | Breen et al. |
| 2005/0230976 A1 | | 10/2005 | Yang |
| 2006/0038572 A1 | * | 2/2006 | Philbrook ............ H01M 2/0267 |
| | | | 324/426 |
| 2006/0097698 A1 | | 5/2006 | Plett |
| 2006/0116797 A1 | | 6/2006 | Moran |
| 2006/0261780 A1 | * | 11/2006 | Edington ............... H01M 10/48 |
| | | | 320/130 |
| 2007/0124037 A1 | | 5/2007 | Moran |
| 2007/0191180 A1 | | 8/2007 | Yang |
| 2007/0229032 A1 | * | 10/2007 | Elder .................... H01M 10/48 |
| | | | 320/132 |
| 2008/0093851 A1 | | 4/2008 | Maeda et al. |
| 2008/0211459 A1 | | 9/2008 | Choi |
| 2008/0238356 A1 | | 10/2008 | Batson et al. |
| 2008/0309288 A1 | | 12/2008 | Benckenstein et al. |
| 2009/0015206 A1 | | 1/2009 | Seman, Jr. et al. |
| 2009/0167247 A1 | | 7/2009 | Bai et al. |
| 2009/0222158 A1 | | 9/2009 | Kubota et al. |
| 2009/0243540 A1 | | 10/2009 | Choi et al. |
| 2010/0076706 A1 | * | 3/2010 | Elder .................... B60L 3/0046 |
| | | | 702/63 |
| 2010/0145562 A1 | | 6/2010 | Moran |
| 2010/0237829 A1 | | 9/2010 | Tatebayashi et al. |
| 2010/0248008 A1 | | 9/2010 | Sugawara et al. |
| 2011/0014501 A1 | | 1/2011 | Scheucher |
| 2011/0133920 A1 | | 6/2011 | Meadors |
| 2011/0137502 A1 | | 6/2011 | Kato et al. |
| 2011/0231049 A1 | | 9/2011 | Le Brusq et al. |
| 2011/0244283 A1 | | 10/2011 | Seto et al. |
| 2011/0258126 A1 | * | 10/2011 | Patil ...................... G06Q 30/012 |
| | | | 705/302 |
| 2011/0313613 A1 | | 12/2011 | Kawahara et al. |
| 2012/0046892 A1 | | 2/2012 | Fink |
| 2012/0062187 A1 | | 3/2012 | Shim |
| 2012/0068715 A1 | | 3/2012 | Martaeng |
| 2012/0074911 A1 | | 3/2012 | Murao |
| 2012/0089352 A1 | | 4/2012 | Librizzi |
| 2012/0105001 A1 | | 5/2012 | Gallegos et al. |
| 2012/0303225 A1 | | 11/2012 | Futahashi et al. |
| 2012/0330588 A1 | * | 12/2012 | DeMar .................... H04Q 9/00 |
| | | | 702/63 |
| 2013/0002197 A1 | | 1/2013 | Hernandez et al. |
| 2013/0002203 A1 | | 1/2013 | Kuraishi |
| 2013/0043826 A1 | | 2/2013 | Workman et al. |
| 2013/0065093 A1 | | 3/2013 | White et al. |
| 2013/0069661 A1 | | 3/2013 | Rich et al. |
| 2013/0106356 A1 | | 5/2013 | Nakao et al. |
| 2013/0135110 A1 | | 5/2013 | Xie et al. |
| 2013/0328530 A1 | | 12/2013 | Beaston |
| 2013/0337299 A1 | | 12/2013 | Sugawara |
| 2014/0015469 A1 | | 1/2014 | Beaston et al. |
| 2014/0015488 A1 | | 1/2014 | Despesse |
| 2014/0042973 A1 | | 2/2014 | Kawahara et al. |
| 2014/0079963 A1 | | 3/2014 | Takeuchi |
| 2014/0123310 A1 | * | 5/2014 | Cherry .................. G06F 21/602 |
| | | | 726/27 |
| 2014/0220396 A1 | | 8/2014 | Lee et al. |
| 2014/0225622 A1 | | 8/2014 | Kudo et al. |
| 2014/0312828 A1 | | 10/2014 | Vo et al. |
| 2015/0104673 A1 | * | 4/2015 | de Greef ........... H04L 12/40006 |
| | | | 429/7 |
| 2015/0202973 A1 | | 7/2015 | Chang |
| 2015/0349569 A1 | | 12/2015 | Christensen et al. |
| 2016/0111900 A1 | | 4/2016 | Beaston et al. |
| 2016/0141894 A1 | | 5/2016 | Beaston |
| 2017/0040646 A1 | | 2/2017 | Beaston |
| 2017/0077558 A1 | | 3/2017 | Nystrom et al. |
| 2017/0077559 A1 | | 3/2017 | Beaston |
| 2017/0106764 A1 | | 4/2017 | Beaston et al. |
| 2017/0126032 A1 | | 5/2017 | Beaston |
| 2017/0345101 A1 | | 11/2017 | Beaston |

FOREIGN PATENT DOCUMENTS

| | | |
|---|---|---|
| CN | 2648617 Y | 10/2004 |
| CN | 2796215 Y | 7/2006 |
| CN | 1819395 A | 8/2006 |
| CN | 1011992755 A | 6/2008 |
| CN | 101222150 A | 7/2008 |
| CN | 102347627 A | 2/2012 |
| CN | 102570568 A | 7/2012 |
| CN | 102882263 A | 1/2013 |
| CN | 202663154 U | 1/2013 |
| CN | 103119828 A | 5/2013 |
| CN | 103253143 A | 8/2013 |
| CN | 103812150 A | 5/2014 |
| CN | 103975478 A | 8/2014 |
| CN | 104348234 A | 2/2015 |
| CN | 104362695 A | 2/2015 |
| CN | 104362706 A | 2/2015 |
| CN | 104682487 A | 6/2015 |
| CN | 104931888 A | 9/2015 |
| WO | WO 2012/110497 A1 | 8/2012 |

OTHER PUBLICATIONS https://www.merriam-webster.com/dictionary/daisy%20chain.
Chris Bakken and Ives Meadors, applicants; U.S. Appl. No. 61/313,548; publicly available as of Jun. 9, 2011 (filed Mar. 12, 2010); 14 pages including filing receipt, provisional cover sheet, and EFS receipt.
English language abstract of Chinese Patent Publication No. CN 101222150 A, published Jul. 16, 2008, 1 page, retrieved from https://worldwide.espacenet.com.
English language abstract of Chinese Patent Publication No. CN 102570568 A, published Jul. 11, 2012, 1 page, retrieved from https://worldwide.espacenet.com.
English language abstract of Chinese Patent Publication No. CN 102882263 A, published Jan. 16, 2013, 1 page, retrieved from https://worldwide.espacenet.com.
English language abstract of Chinese Patent Publication No. CN 103253143 A, published Aug. 21, 2013, 1 page, retrieved from https://worldwide.espacenet.com.
English language abstract of Chinese Patent Publication No. CN 202663154 U, published Jan. 9, 2013, 1 page, retrieved from https://worldwide.espacenet.com.
Non-Final Office Action dated Dec. 29, 2016 in U.S. Appl. No. 14/678,074, filed Apr. 3, 2015; 16 pages.
U.S. Appl. No. 15/389,188, "Battery Pack Monitoring and Warranty System," to Beaston et al., filed Dec. 22, 2016.
Non-Final Office Action dated May 12, 2015, in U.S. Appl. No. 13/978,689, filed Aug. 27, 2013; 12 pages.

(56) References Cited

OTHER PUBLICATIONS

Final Office Action dated Sep. 21, 2015, in U.S. Appl. No. 13/978,689, filed Aug. 27, 2013; 12 pages.
Non-Final Office Action dated Nov. 23, 2015, in U.S. Appl. No. 13/978,689, filed Aug. 27, 2013; 11 pages.
Notice of Allowance dated Mar. 21, 2016, in U.S. Appl. No. 13/978,689, filed Aug. 27, 2013; 8 pages.
International Preliminary Report on Patentability, dated Sep. 10, 2013, in International Patent Application No. PCT/CN2011/071548; 5 pages.
International Search Report and Written Opinion on Patentability, dated Dec. 1, 2011, in International Patent Application No. PCT/CN2011/071548; 10 pages.
U.S. Appl. No. 14/678,074, "Electrical Energy Storage Unit and Control System and Applications Thereof," to Beaston, et al., filed Apr. 3, 2015.
U.S. Appl. No. 14/851,460, "Battery Management System (BMS) Having Isolated, Distributed, Daisy-Chained Battery Module Controllers," to Nystrom, et al., filed Sep. 11, 2015.
U.S. Appl. No. 14/851,482, "Battery Pack with Integrated Battery Management System," to Beaston, et al., filed Sep. 11, 2015.
U.S. Appl. No. 14/932,688, "Battery Energy Storage System," to Beaston, filed Nov. 4, 2015.
U.S. Appl. No. 14/962,491, "Battery Energy Storage System and Control System and Applications Thereof," to Beaston, filed Dec. 8, 2015.
U.S. Appl. No. 14/819,774, "Systems and Methods for Detecting a Battery Pack Having an Operating Issue or Defect," to Beaston, filed Aug. 6, 2015.
U.S. Appl. No. 14/884,463, "Battery-Assisted Electric Vehicle Charging System and Method," to Beaston et al., filed Oct. 15, 2015.
English translation for Chinese patent publication No. CN 103119828 A, published May 22, 2013, 13 pages, translated by Google Patents at https://patents.google.com.
English translation for Chinese patent publication No. CN 103812150 A, published May 21, 2014, 7 pages, translated by Google Patents at https://patents.google.com.
English translation for Chinese patent publication No. CN 104931888 A, published Sep. 23, 2015, 10 pages, translated by Google Patents at https://patents.google.com.
English translation for Chinese patent publication No. CN 1319189 A, published Oct. 24, 2001, 12 pages, translated by Google Patents at https://patents.google.com.
English translation for Chinese patent publication No. CN 102347627 A, published Feb. 8, 2012, 12 pages, translated by Google Patents at https://patents.google.com.
English translation for Chinese patent publication No. CN 103975478 A, published Aug. 6, 2014, 7 pages, translated by Google Patents at https://patents.google.com.
English translation for Chinese patent publication No. CN 104348234 A, published Feb. 11, 2015, 7 pages, translated by Google Patents at https://patents.google.com.
English translation for Chinese patent publication No. CN 104362695 A, published Feb. 18, 2015, 7 pages, translated by Google Patents at https://patents.google.com.
English translation for Chinese patent publication No. CN 104362706 A, published Feb. 18, 2015, 5 pages, translated by Google Patents at https://patents.google.com.
English translation for Chinese patent publication No. CN 104682487 A, published Jun. 3, 2015, 17 pages, translated by Google Patents at https://patents.google.com.
"Battery Management Systems on Power Batteries: Applied Technology and Advanced Theories," Linear Technology Corporation, 2014, pp. 104-109 and 125-131.
"UPS," 1990, pp. 139-141.

\* cited by examiner

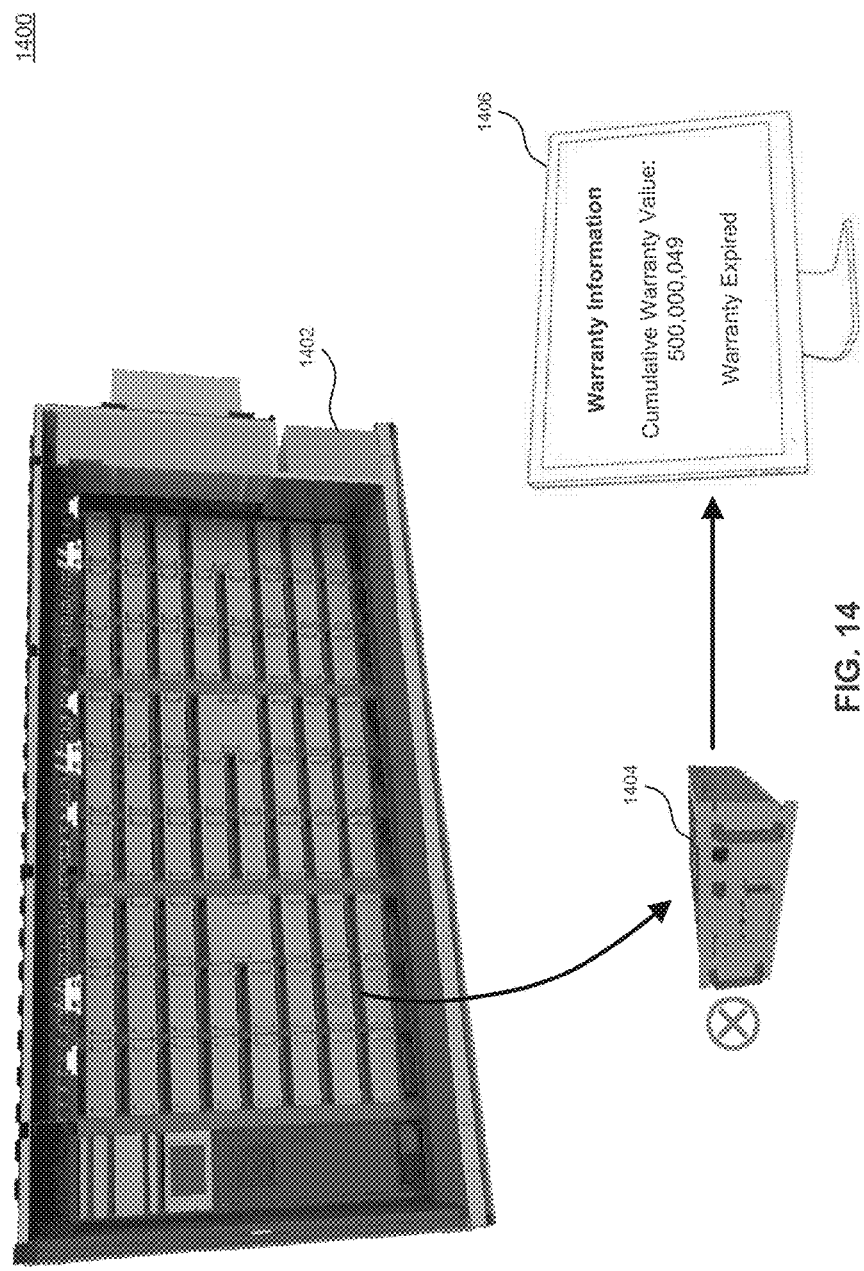

WARRANTY TRACKER FOR A BATTERY PACK

BACKGROUND

Field

Embodiments of the systems and methods described herein are generally related to warranty applications for battery packs.

Background

Large, multi-cell battery packs typically cost substantially more than common consumer batteries, such as cellular phone and laptop batteries. Replacement of defective battery packs can lead to significant expense for a consumer, and therefore, consumers expect proper function of each battery pack. A warranty may provide assurance to the purchaser of a battery pack in case of any defects.

SUMMARY

Systems and methods are disclosed for a warranty tracker embedded in a battery pack. In an embodiment, the warranty tracker may include a memory device and a warranty controller. The warranty controller may receive an electric current measurement indicating a rate of charge or discharge of the battery pack from a device that is external to the battery pack. A warranty value may then be calculated using the received electric current measurement and added to a stored cumulative warranty value. The memory device may store the cumulative warranty value, which may be used to evaluate warranty conditions. In various embodiments, the warranty tracker may also include a temperature sensor and/or a voltage sensor. The warranty controller may then use received temperature and/or voltage measurements in the calculation of the warranty value.

In an embodiment, when a battery pack is determined to be defective, an alert may be received. The stored cumulative warranty value may then be compared to a predefined threshold value. A warranty for the battery pack may be determined to be expired when the cumulative warranty value exceeds the threshold value.

Further embodiments, features, and advantages of the invention, as well as the structure and operation of the various embodiments, are described in detail below with reference to accompanying drawings.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art to make and use the disclosure.

FIG. 14 is a diagram illustrating a defective battery pack and associated warranty information, according to an embodiment.

In the drawings, like reference numbers may indicate identical or functionally similar elements.

DETAILED DESCRIPTION

While the present disclosure is described herein with illustrative embodiments for particular applications, it should be understood that the disclosure is not limited thereto. A person skilled in the art with access to the teachings provided herein will recognize additional modifications, applications, and embodiments within the scope thereof and additional fields in which the disclosure would be of significant utility.

The terms "embodiments" or "example embodiments" do not require that all embodiments include the discussed feature, advantage, or mode of operation. Alternate embodiments may be devised without departing from the scope or spirit of the disclosure, and well-known elements may not be described in detail or may be omitted so as not to obscure the relevant details. In addition, the terminology used herein is for the purpose of describing particular embodiments only and is not intended to be limiting. For example, as used herein, the singular forms "a," "an" and "the" are intended to include the plural forms as well, unless the context clearly indicates otherwise. It will be further understood that the terms "comprises," "comprising," "includes" and "including," when used herein, specify the presence of stated features, integers, steps, operations, elements, and components, but do not preclude the presence or addition of one or more other features, integers, steps, operations, elements, components or groups thereof.

Figure 1A:
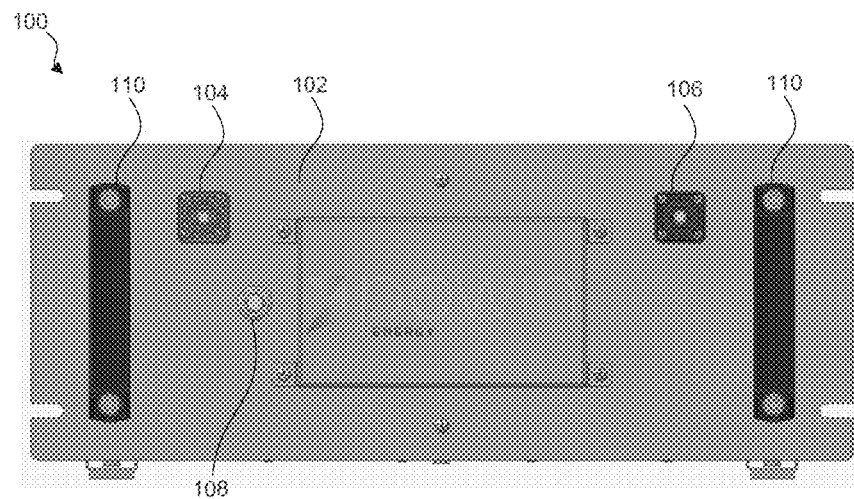
FIGS. 1A, 1B, and 1C are diagrams illustrating an example battery pack.
Figure 1B:
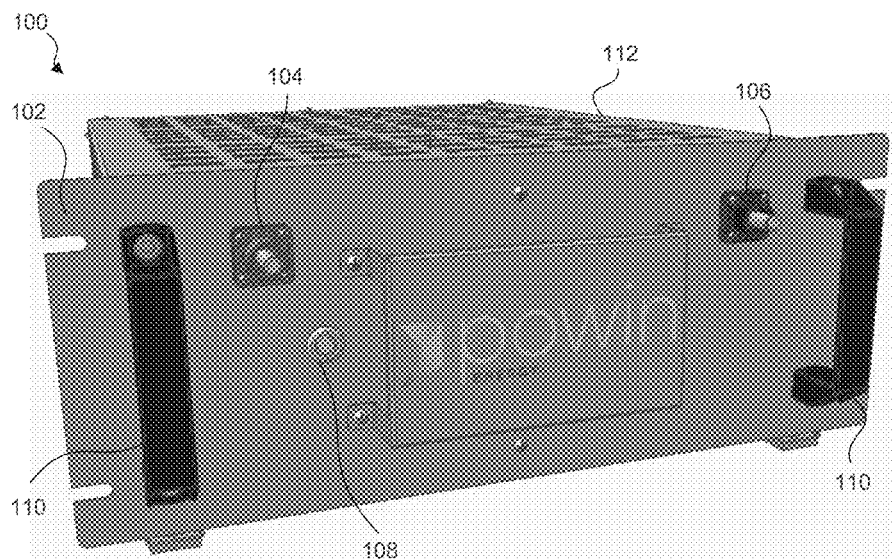
Figure 1C:
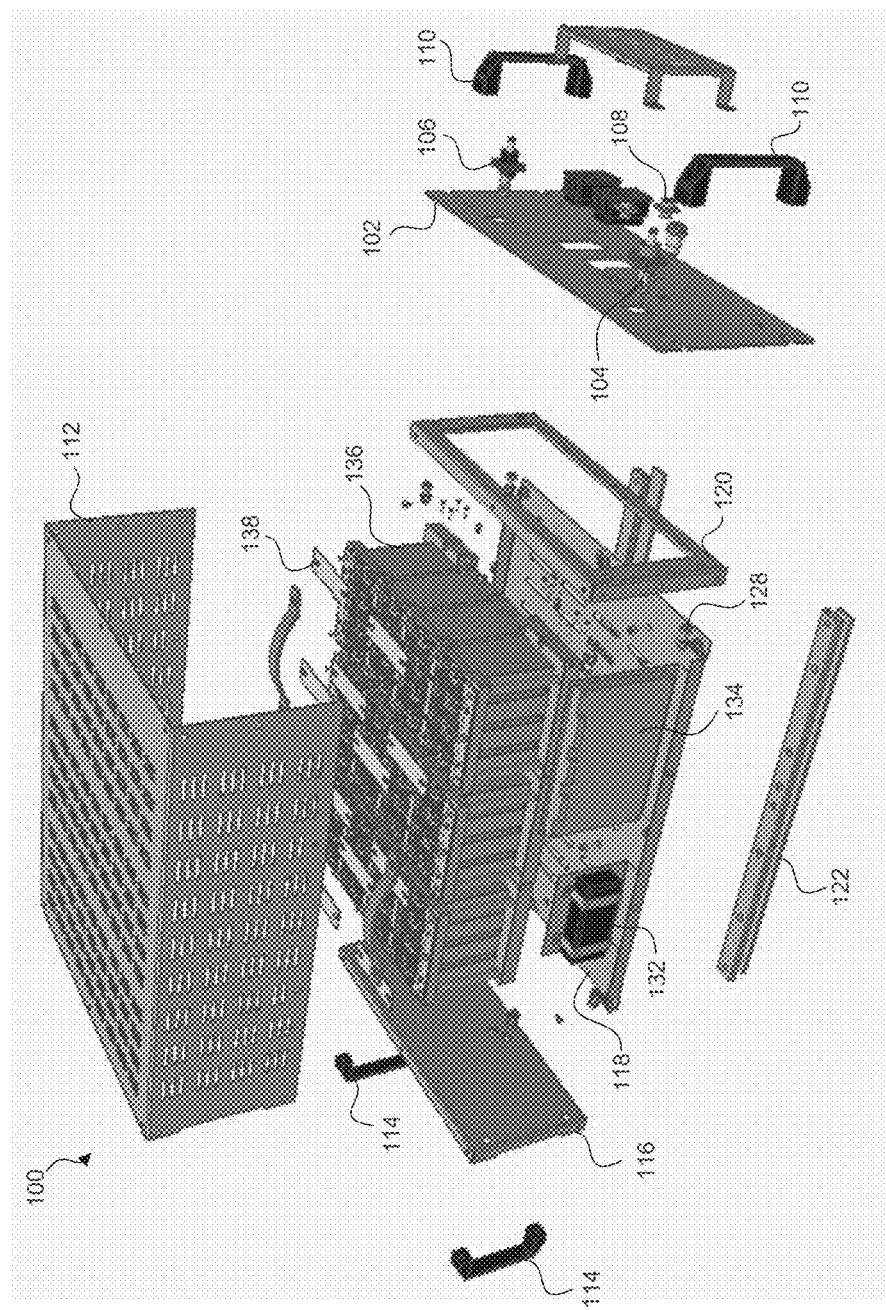

FIGS. 1A, 1B, and 1C are diagrams that illustrate an example battery pack 100 according to an embodiment of the disclosure. Specifically, FIGS. 1A and 1B depict front views of battery pack 100 and FIG. 1C depicts an exploded view of battery pack 100. As shown in FIGS. 1A-C, the housing of battery pack 100 may include a front panel 102, a lid or cover 112, a back panel 116, and a bottom 118. The lid 112, which includes left and right side portions, may include a plurality of air vents to facilitate air flow through battery pack 100 and aid in cooling the internal components of battery pack 100. In a non-limiting embodiment, the lid 112 is "U"-shaped and may be fabricated from a single piece of metal, plastic, or any other material known to one of ordinary skill in the art.

The housing of battery pack 100 may be assembled using fasteners 128 shown in FIG. 1C, which may be screws and bolts or any other fastener known to one of ordinary skill in the art. The housing of battery pack 100 may also include front handles 110 and back handles 114. As shown in FIG. 1C, front plate 102 may be coupled to lid 112 and bottom 118 via front panel mount 120. M one embodiment, battery pack 100 is implemented as a rack-mountable equipment module. For example, battery pack 100 may be implemented as a standard 19-inch rack (e.g., front panel 102 having a width of 19 inches, and battery pack 100 having a depth of between 22 and 24 inches and a height of 4 rack units or "U," where U is a standard unit that is equal to 1.752 inches). As shown in FIG. 1C, battery pack 100 may include one or more mounts 122 attached to bottom 118. Mount 122 may be used to secure battery pack 100 in a rack in order to arrange a plurality of battery packs in a stacked configuration (shown in FIG. 5).

In FIGS. 1A-C, battery pack 100 includes a power connector 104 for connecting to the negative terminal of the battery pack and a power connector 106 for connecting to a positive terminal of the battery pack. As shown in FIGS. 1A and 1B, the power connectors 104 and 106 may be provided on the front plate 102 of battery pack 100. Power cables (not shown) may be attached to the power connectors 104 and 106 and used to add or remove energy from the battery pack 100.

The front plate 102 of battery pack 100 may also include a status light and reset button 108. In one embodiment, status button 108 is a push button that can be depressed to reset or restart battery pack 100. In one embodiment, the outer ring around the center of button 108 may be illuminated to indicate the operating status of battery pack 100. The illumination may be generated by a light source, such as one or more light emitting diodes, that is coupled to or part of the status button 108. In this embodiment, different color illumination may indicate different operating states of the battery pack. For example, constant or steady green light may indicate that battery pack 100 is in a normal operating state; flashing or strobing green light may indicate that battery pack 100 is in a normal operating state and that battery pack 100 is currently balancing the batteries; constant or steady yellow light may indicate a warning or that battery pack 100 is in an error state; flashing or strobing yellow light may indicate a warning or that battery pack 100 is in an error state and that battery pack 100 is currently balancing the batteries; constant or steady red light may indicate that the battery pack 100 is in an alarm state; flashing or strobing red light may indicate that battery pack 100 needs to be replaced; and no tight emitted from the status light may indicate that battery pack 100 has no power and/or needs to be replaced. In some embodiments, when the status light emits red light (steady or flashing) or no light, connectors in battery pack 100 or in an external controller are automatically opened to prevent charging or discharging of the batteries. As would be apparent to one of ordinary skill in the art, any color, strobing technique, etc., of illumination to indicate the operating status of battery pack 100 is within the scope of this disclosure.

Turning to FIG. 1C, example components that are disposed inside the housing of battery pack 100 are shown, including (but not limited to) balancing charger 132, battery pack controller (BPC) 134, and battery module controller (BMC) 138. Balancing charger 132 may be a power supply, such as a DC power supply, and may provide energy to all of the battery cells in a battery pack. BMC 138 is coupled to battery module 136 and may selectively discharge energy from the battery cells that are included in battery module 136, as well as take measurements (e.g., voltage and temperature) of battery module 136. BPC 134 may control balancing charger 132 and BMC 138 to balance or adjust the voltage and/or state of charge of a battery module to a target voltage and/or state of charge value.

As shown, battery pack 100 includes a plurality of battery modules and a BMC (e.g., battery module controller 138) is coupled to each battery module (e.g., battery module 136). In one embodiment, which is described in more detail below, n BMCs (where n is greater than or equal to 2) can be daisy-chained together and coupled to a BPC to form a single-wire communication network. In this example arrangement, each BMC may have a unique address and the BPC may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. In one embodiment, BPC 134 may obtain measurements (e.g., temperature, voltage) from each of the BMCs using a polling technique. BPC 134 may calculate or receive (e.g., from a controller outside of battery pack 100) a target voltage for battery pack 100, and may use the balancing charger 132 and the network of BMCs to adjust each of the battery modules to the target voltage. Thus, battery pack 100 may be considered a smart battery pack, able to self-adjust its battery cells to a target voltage.

The electrical wiring that connects various components of battery pack 100 has been omitted from FIG. 1C to enhance viewability. In the illustrated embodiment, balancing charger 132 and battery pack controller 134 may be connected to or mounted on the bottom 118. While shown as mounted on the left side of battery pack 100, balancing charger 132 and battery pack controller 134, as well as all other components disposed in battery pack 100, may be disposed at any location within battery pack 100.

Battery module 136 includes a plurality of battery cells. Any number of battery cells may be included in battery module 136. Example battery cells include, but are not limited to, Li ion battery cells, such as 18650 or 26650 battery cells. The battery cells may be cylindrical battery cells, prismatic battery cells, or pouch battery cells, to name a few examples. The battery cells or battery modules may be, for example, up to 100 AH battery cells or battery modules. In some embodiments, the battery cells are connected in series/parallel configuration. Example battery cell configurations include, but are not limited to, 1P16S configuration, 2P16S configuration, 3P16S configuration, 4P16S configuration, 1P12S configuration, 2P12S configuration, 3P12S configuration, and 4P12S configuration. Other configurations known to one of ordinary skill in the art are within the scope of this disclosure. Battery module 136 includes positive and negative terminals for adding energy to and removing energy from the plurality of battery cells included therein.

As shown in FIG. 1C, battery pack 100 includes 12 battery modules that form a battery assembly. In another embodiment, battery pack 100 may include 16 battery modules that form a battery assembly. In other embodiments, battery pack 100 may include 20 battery modules or 25 battery modules that form a battery assembly. As would be apparent to one of ordinary skill in the art, any number of battery modules may be connected to form the battery assembly of battery pack 100. In battery pack 100, the battery modules that are arranged as a battery assembly may be arranged in a series configuration.

Figure 2:
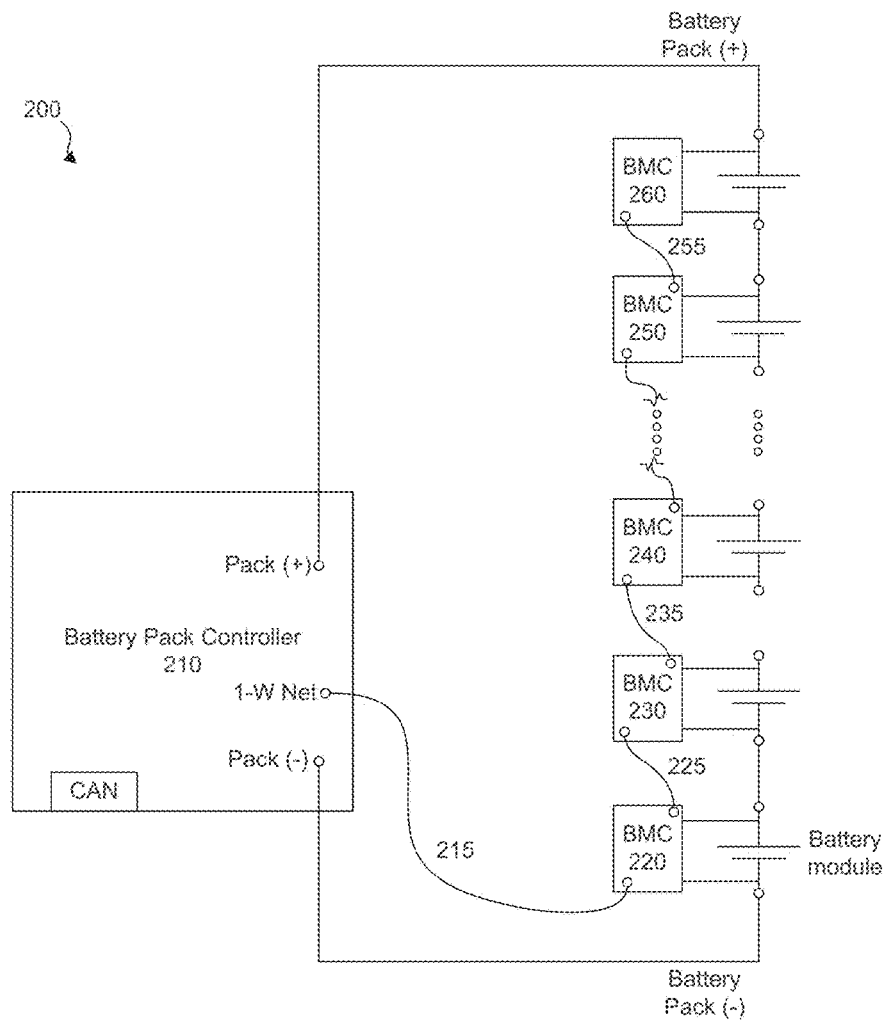
FIG. 2 is a diagram illustrating an example communication network formed by a battery pack controller and a plurality of battery module controllers.

In FIG. 1C, battery module controller 138 is coupled to battery module 136. Battery module controller 138 may be couple to the positive and negative terminals of battery module 136. Battery module controller 138 may be configured to perform one, some, or all of the following functions: remove energy from battery module 136, measure the voltage of battery module 136, and measure the temperature of battery module 136. As would be understood by one of ordinary skill in the art, battery module controller 138 is not limited to performing the functions just described. In one embodiment, battery module controller 138 is implemented as one or more circuits disposed on a printed circuit board. In battery pack 100, one battery module controller is coupled to or mounted on each of the battery modules in battery pack 100. Additionally, each battery module controller may be coupled to one or more adjacent battery module controllers via wiring to form a communication network. As illustrated in FIG. 2, n battery module controllers (where n is a whole number greater than or equal to two) may be daisy-chained together and coupled to a battery pack controller to form a communication network.

FIG. 2 is a diagram illustrating an example communication network 200 formed by a battery pack controller and a plurality of battery module controllers. In FIG. 2, battery pack controller (BPC) 210 is coupled to n battery module controllers (BMCs) 220, 230, 240, 250, and 260. Said another way, n battery module controllers (where n is a whole number greater than or equal to two) are daisy-chained together and coupled to battery pack controller 210 to form communication network 200, which may be referred to as a distributed, daisy-chained battery management system (BMS). Specifically, BPC 210 is coupled to BMC 220 via communication wire 215, BMC 220 is coupled to BMC 230 via communication wire 225, BMC 230 is coupled to BMC 240 via communication wire 235, and BMC 250 is coupled to BMC 260 via communication wire 255 to form the communication network. Each communication wire 215, 225, 235, and 255 may be a single wire, forming a single-wire communication network that allows the BCM 210 to communicate with each of the BCMs 220-260, and vice versa. As would be apparent to one of skill in the art, any number of BMCs may be daisy chained together in communication network 200.

Each BMC in the communication network 200 may have a unique address that BCP 210 uses to communicate with individual BMCs. For example, BMC 220 may have an address of 0002, BMC 230 may have an address of 0003, BMC 240 may have an address of 0004, BMC 350 may have an address of 0005, and BMC 360 may have an address of 0006. BPC 210 may communicate with each of the BMCs by addressing one or more messages to the unique address of any desired BMC. The one or more messages (which include the unique address of the BMC) may include an instruction to, for example, remove energy from a battery module, to stop removing energy from a battery module, to measure and report the temperature of the battery module, and to measure and report the voltage of the battery module. BPC 210 may poll the BMCs to obtain measurements related to the battery modules of the battery pack, such as voltage and temperature measurements. Any polling technique known to one of skill in the art may be used. In some embodiments, BPC 210 continuously polls the BMCs for measurements in order to continuously monitor the voltage and temperature of the battery modules in battery pack 100.

For example, BPC 210 may seek to communicate with BMC 240, e.g., in order to obtain temperature and voltage measurements of the battery module that BMC 240 is mounted on. In this example, BPC 210 generates and sends a message (or instruction) addressed to BMC 240 (e.g., address 0004). The other BMCs in the communication network 200 may decode the address of the message sent by BPC 210, but only the BMC (in this example, BMC 240) having the unique address of the message may respond. In this example, BMC 240 receives the message from BPC 210 (e.g., the message traverses communication wires 215, 225, and 235 to reach BMC 240), and generates and sends a response to BPC 210 via the single-wire communication network (e.g., the response traverses communication wires 235, 225, and 215 to reach BPC 210). BPC 210 may receive the response and instruct BMC 240 to perform a function (e.g., remove energy from the battery module it is mounted on). In other embodiments, other types of communication networks (other than communication network 200) may be used, such as, for example, an RS232 or RS485 communication network.

Figure 3:
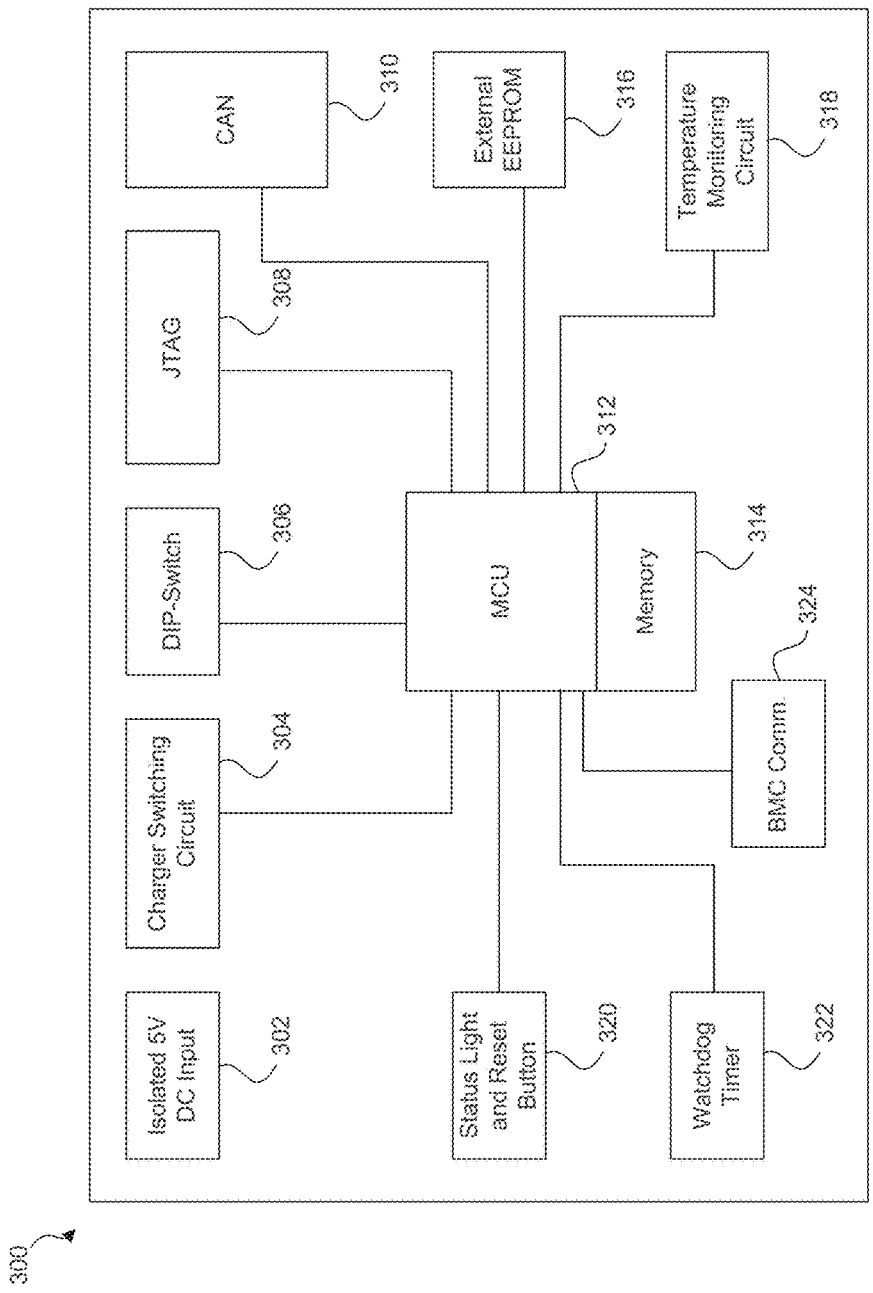
FIG. 3 is a diagram illustrating an example battery pack controller.

FIG. 3 is a diagram illustrating an example battery pack controller 300 according to an embodiment of the disclosure. Battery pack controller 134 of FIG. 1C may be implemented as described in accordance with battery pack controller 300 of FIG. 3. Battery pack controller 210 of FIG. 2 may be implemented as described in accordance with battery pack controller 300 of FIG. 3.

As shown in FIG. 3, the example battery pack controller 300 includes a DC input 302 (which may be an isolated 5V DC input), a charger switching circuit 304, a DIP-switch 306, a JTAG connection 308, a CAN (CANBus) connection 310, a microprocessor unit (MCU) 312, memory 314, an external EEPROM 316, a temperature monitoring circuit 318, a status light and reset button 320, a watchdog timer 322, and a battery module controller (BMC) communication connection 324.

In one embodiment, battery pack controller 300 may be powered from energy stored in the battery cells. Battery pack controller 300 may be connected to the battery cells by DC input 302. In other embodiments, battery pack controller 300 may be powered from an AC to DC power supply connected to DC input 302. In these embodiments, a DC-DC power supply may then convert the input DC power to one or more power levels appropriate for operating the various electrical components of battery pack controller 300.

In the example embodiment illustrated in FIG. 3, charger switching circuit 304 is coupled to MCU 312. Charger switching circuit 304 and MCU 312 may be used to control operation of a balancing charger, such as balancing charger 132 of FIG. 1C. As described above, a balancing charger may add energy to the battery cells of the battery pack. In an embodiment, temperature monitoring circuit 318 includes one or more temperature sensors that can monitor the temperature heat sources within the battery pack, such as the temperature of the balancing charger that is used to add energy to the battery cells of the battery pack.

Battery pack controller 300 may also include several interfaces and/or connectors for communicating. These interfaces and/or connectors may be coupled to MCU 312 as shown in FIG. 3. In one embodiment, these interfaces and/or connectors include: DIP-switch 306, which may be used to set a portion of software bits used to identify battery pack controller 300; JTAG connection 308, which may be used for testing and debugging battery pack controller 300; CAN (CANBus) connection 310, which may be used to communicate with a controller that is outside of battery pack 100; and BMC communication connection 324, which may be used to communicate with one or more battery module controllers, such as a distributed, daisy-chained network of battery module controllers (e.g., FIG. 2). For example, battery pack controller 300 may be coupled to a communication wire, e.g., communication wire 215 of FIG. 2, via BMC communication connection 324.

Battery pack controller 300 also includes an external EEPROM 316. External EEPROM 316 may store values, measurements, etc., for the battery pack. These values, measurements, etc., may persist when power of battery pack 100 is turned off (i.e., will not be lost due to loss of power). External EEPROM 316 may also store executable code or instructions, such as executable code or instructions to operate microprocessor unit 312.

Microprocessor unit (MCU) 312 is coupled to memory 314. MCU 312 is used to execute an application program that manages the battery pack. As described herein, in an embodiment the application program may perform the following functions (but is not limited thereto): monitor the voltage and temperature of the battery cells of battery pack 100, balance the battery cells of battery pack 100, monitor and control (if needed) the temperature of battery pack 100, handle communications between battery pack 100 and other components of an electrical energy storage system (see FIG. 5 below), and generate warnings and/or alarms, as well as take other appropriate actions, to protect the battery cells of battery pack 100.

As described above, a battery pack controller may obtain temperature and voltage measurements from battery module controllers. The temperature readings may be used to ensure that the battery cells are operated within their specified temperature limits and to adjust temperature related values calculated and/or used by the application program executing on MCU 312. Similarly, the voltage readings are used, for example, to ensure that the battery cells are operated within their specified voltage limits.

Watchdog timer 322 is used to monitor and ensure the proper operation of battery pack controller 300. In the event that an unrecoverable error or unintended infinite software loop should occur during operation of battery pack controller 300, watchdog timer 322 can reset battery pack controller 300 so that it resumes operating normally. Status light and reset button 320 may be used to manually reset operation of battery pack controller 300. As shown in FIG. 3, status light and reset button 320 and watchdog timer 322 may be coupled to MCU 312.

Figure 4:
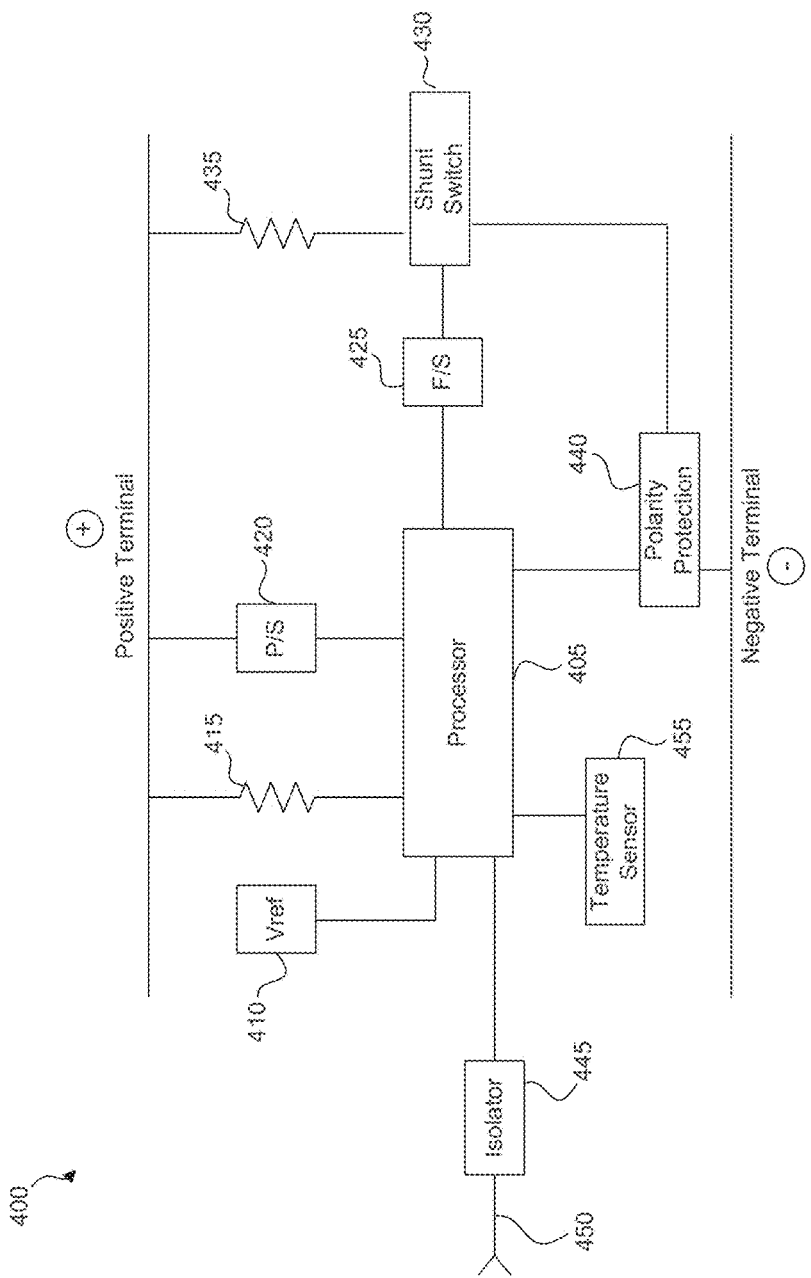
FIG. 4 is a diagram illustrating an example battery module controller.

FIG. 4 illustrates an example battery module controller 400 according to an embodiment of the disclosure. Battery module controller 138 of FIG. 1C may be implemented as described in accordance with battery module controller 400 of FIG. 4. Each of battery module controllers 220, 230, 240, 250, and 260 of FIG. 2 may be implemented as described in accordance with battery module controller 400 of FIG. 4. Battery module controller 400 may be mounted on a battery module of a battery pack and may perform the following functions (but is not limited thereto): measure the voltage of the battery module, measure the temperature of the battery module, and remove energy from (discharge) the battery module.

In FIG. 4, the battery module controller 400 includes processor 405, voltage reference 410, one or more voltage test resistors 415, power supply 420, fail safe circuit 425, shunt switch 430, one or more shunt resistors 435, polarity protection circuit 440, isolation circuit 445, and communication wire 450. Processor 405 controls the battery module controller 400. Processor 405 receives power from the battery module that battery module controller 400 is mounted on via the power supply 420. Power supply 420 may be a DC power supply. As shown in FIG. 4, power supply 420 is coupled to the positive terminal of the battery module, and provides power to processor 405. Processor 405 is also coupled to the negative terminal of the battery module via polarity protection circuit 440, which protects battery module controller 400 in the event that it is improperly mounted on a battery module (e.g., the components of battery module controller 400 that are coupled to the positive terminal in FIG. 4 are improperly coupled to the negative terminal and vice versa).

Battery module controller 400 may communicate with other components of a battery pack (e.g., a battery pack controller) via communication wire 450, which may be a single wire. As described with respect to the example communication network of FIG. 2, communication wire 450 may be used to daisy chain battery module controller 400 to a battery pack controller and/or one or more other battery module controllers to form a communication network. As such, battery module controller 400 may send and receive messages (including instructions sent from a battery pack controller) via communication wire 450. When functioning as part of a communication network, battery module controller 400 may be assigned a unique network address, which may be stored in a memory device of the processor 405.

Battery module controller 400 may be electrically isolated from other components that are coupled to the communication wire (e.g., battery pack controller, other battery module controllers) via isolation circuit 445. In FIG. 4, isolation circuit 445 is disposed between communication wire 450 and processor 405. Isolation circuit 445 may capacitively couple processor 405 to communication wire 450, or may provide other forms of electrical isolation known to those of skill in the art.

As explained above, battery module controller 400 may measure the voltage of the battery module it is mounted on. As shown in FIG. 4, processor 405 is coupled to voltage test resistor 415, which is coupled to the positive terminal of the battery module. Processor 405 may measure the voltage across voltage test resistor 415, and compare this measured voltage to voltage reference 410 to determine the voltage of the battery module. As described with respect to FIG. 2, battery module controller 400 may be instructed to measure the voltage of the battery module by a battery pack controller. After performing the voltage measurement, processor 405 may report the voltage measurement to a battery pack controller via communication wire 450.

Battery module controller 400 may also remove energy from the battery module that it is mounted on. As shown in FIG. 4, processor 405 is coupled to fail safe circuit 425, which is coupled to shunt switch 430. Shunt switch 430 is also coupled to the negative terminal via polarity protection circuit 440. Shunt resistor 435 is disposed between the positive terminal of the battery module and shunt switch 430. In this embodiment, when shunt switch 430 is open, shunt resistor 435 is not applied across the positive and negative terminals of the battery module; and when shunt switch 430 is closed, shunt resistor 435 is applied across the positive and negative terminals of the battery module in order to remove energy from the battery module. Processor 405 may instruct shunt switch 430 to selectively apply shunt resistor 435 across the positive and negative terminals of the battery module in order to remove energy from the battery module. In one embodiment, processor 405 instructs shunt switch 430 at regular intervals (e.g., once every 30 seconds) to apply shunt resistor 435 in order to continuously discharge the battery module.

Fail safe circuit 425 may prevent shunt switch 430 from removing too much energy from the battery module. In the event that processor 405 malfunctions, fail safe circuit 425 may instruct shunt switch 430 to stop applying shunt resistor 435 across the positive and negative terminals of the battery module. For example, processor 405 may instruct shunt switch 430 at regular intervals (e.g., once every 30 seconds) to apply shunt resistor 435 in order to continuously discharge the battery module. Fail safe circuit 425, which is disposed between processor 405 and shunt switch 430, may monitor the instructions processor 405 sends to shunt switch 430. In the event that processor 405 fails to send a scheduled instruction to the shunt switch 430 (which may be caused by a malfunction of processor 405), fails safe circuit 425 may instruct or cause shunt switch 430 to open, preventing further discharge of the battery module.

Battery module controller 400 of FIG. 4 also includes temperature sensor 455, which may measure the temperature of the battery module that battery module controller 400 is connected to. As depicted in FIG. 4, temperature sensor 455 is coupled to processor 405, and may provide temperature measurements to processor 405. Any temperature sensor known to those skilled in the art may be used to implement temperature sensor 455.

Figure 5:
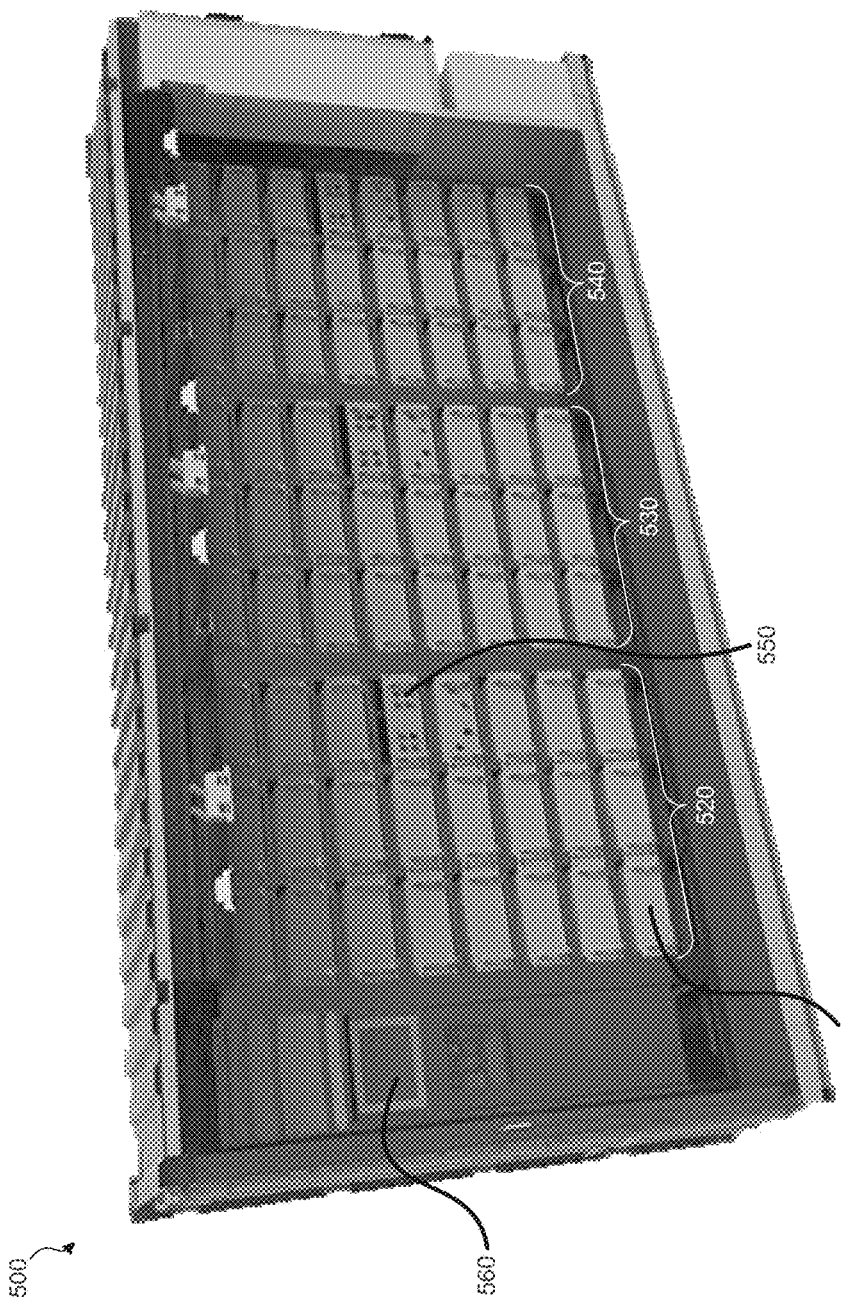
FIG. 5 is a diagram illustrating an example battery energy storage system.

FIG. 5 is a diagram that illustrates battery energy storage system 500. Battery energy storage system 500 can be operated as a stand-alone system, or it can be combined together with other battery energy storage systems to form a part of a larger battery energy storage system. Battery energy storage system 500 may be highly scalable, ranging from a small kilowatt-hour size battery energy storage system to a megawatt-hour size battery energy storage system. In the embodiment illustrated in FIG. 5, battery energy storage system 500 is housed in a container (similar to a shipping container) and is movable (e.g., transported by a truck). Other housings known to those skilled in the art are within the scope of this disclosure.

As shown in FIG. 5, battery energy storage system 500 includes a plurality of battery packs, such as battery pack 510. Battery pack 510 may be implemented as described with respect to FIGS. 1-4 above. As explained above, each battery pack includes battery cells (which may be arranged into battery modules), a battery pack controller that monitors the battery cells, a balancing charger (e.g., DC power supply) that adds energy to each of the battery cells, and a distributed, daisy-chained network of battery module controllers that may take certain measurements of and remove energy from the battery cells. As explained, the battery pack controller may control the network of battery module controllers and the balancing charger to control the state-of-charge or voltage of a battery pack.

The battery packs of battery energy storage system 500 may be mounted on racks. A plurality of battery packs may be connected in series, which may be referred to as a string of battery packs or a battery pack string. For example, battery pack 510 may be connected in series with other battery packs to form battery pack string 520. FIG. 5 illustrates three battery pack strings 520, 530, and 540. A plurality of battery pack strings may be connected in parallel to form a battery energy storage system.

Each battery pack string may be controlled by a controller, which may be referred to as a string controller. For example, battery pack string 520 may be controlled by string controller 550. As its name suggests, a string controller may monitor and control the battery packs of a string. In an embodiment, the plurality of string controllers may be linked together using CAN (CANBus) communications, which enables the string controllers to operate together as part of an overall network of battery string controllers. This network of battery string controllers can manage and operate any size battery system such as, for example, a multi-megawatt-hour centralized battery energy storage system. In an embodiment, one of the networked battery string controllers (such as battery string controller 550) can be designated as a master battery string controller and used to control battery charge and discharge operations by sending commands that operate one or more inverters and/or chargers connected to the battery system. Alternatively, a computer or system controller 560 may be coupled to and control the string controllers in a battery energy storage system. A string controller may communicate with the battery pack controller in each of the battery packs in its string (e.g., string controller 550 may communicate with the BPC in battery pack 510) to monitor and control charging and discharging of the battery packs, in one embodiment, a string controller sends each battery pack in its string a target voltage, and the battery packs adjust the battery cells to the target voltage. A string controller and BPC may also communicate measurements (e.g., voltage, temperature, current values), and also perform diagnostic procedures, startup procedures, and the like.

In an embodiment battery energy storage system 500 includes or is otherwise coupled to a bi-directional power converter. The bi-directional power converter may charge and discharge battery packs using commands issued, for example, via a computer over a network (e.g., the Internet, an Ethernet, etc.). In one embodiment, an operator at a utility may use a networked computer to control battery energy storage system 500. Both the real power and the reactive power of the bi-directional power converter may be controlled. Also, in some embodiments, the hi-directional power converter can be operated as a backup power source when grid power is not available and/or the battery energy storage unit is disconnected from the power grid.

Battery energy storage system 500 may be used as a part of a renewable wind energy system, which includes wind turbines. Energy from the wind turbines may be stored in and selectively discharged from battery energy storage system 500. Similarly, battery energy storage system 500 may be used as a part of a renewable solar energy system, which includes a solar array. Energy from the solar array may be stored in and selectively discharged from the battery energy storage system 500. Additionally, battery energy storage system 500 may be used as a part of a grid energy system (power grid), which includes electrical equipment. Energy from grid energy system may be stored in and selectively discharged from battery energy storage system 500.

In an embodiment, a warranty based on battery usage for a battery pack, such as battery pack 100 of FIGS. 1A-C, may take into account various data associated with the battery pack, such as but not limited to, charge and discharge rates, battery temperature, and battery voltage. A warranty tracker embedded in the battery pack may use this data to compute a warranty value representing battery usage for a period of time. Calculated warranty values may be aggregated over the life of the battery, and the cumulative value may be used to determine warranty coverage. With this approach, the warranty may not only factor in the total discharge of the battery pack, but also the manner in which the battery pack has been used. Various data used to calculate warranty values, according to an embodiment, are discussed further with respect to FIGS. 6-9.

Figure 6:
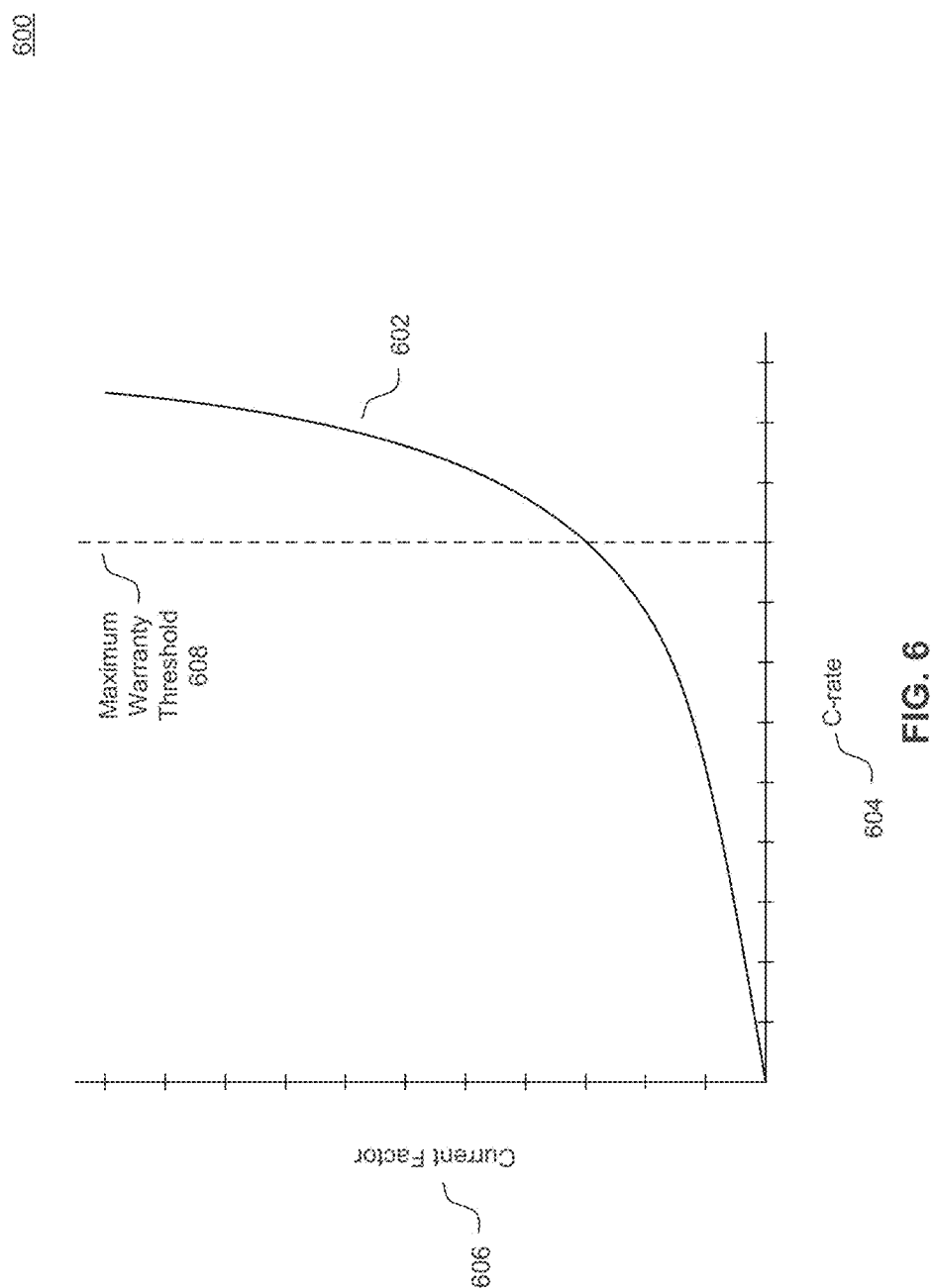
FIG. 6 is a diagram illustrating a correlation between an electric current measurement and a current factor used in the calculation of a warranty value, according to an embodiment.

Charge and discharge rates of a battery pack are related to and can be approximated or determined based on the amount of electric current flowing into and out of the battery pack, which can be measured. In general, higher charge and discharge rates may produce more heat (than lower rates), which may cause stress on the battery pack, shorten the life of the battery pack, and/or lead to unexpected failures or other issues. FIG. 6 is a diagram illustrating an example correlation between an electric current measurement and a current factor used in the calculation of a warranty value according to an embodiment. Electric current may be directly measured for a battery pack, such as battery pack 100 of FIGS. 1A-C, and may provide charge and/or discharge rates of the battery pack.

Normal charge and discharge rates for batteries of different capacities may vary. For this reason, in an embodiment, electric current measurements may be normalized in order to apply a standard for determining normal charge and discharge rates for different battery packs. One of skill in the art will recognize that the measured electric current may be normalized based on the capacity of the battery pack, producing a C-rate. As an example, a normalized rate of discharge of 1 C would deliver the battery pack's rated capacity in one hour, e.g., a 1,000 mAh battery would provide a discharge current of 1,000 mA for one hour. The C-rate may allow the same standard to be applied for determining normal charge and discharge, whether the battery pack is rated at 11,000 mAh or 100 Ah or any other rating known to one of ordinary skill in the art.

Still considering FIG. 6, example plot 602 illustrates current factor 606 as a function of a normalized C-rate 604, according to an embodiment. Electric current measurements may be used to calculate warranty values by converting the measured electric current to a corresponding current factor. In an embodiment, the measured electric current is first normalized to produce a C-rate. The C-rate indicates the charge or discharge rate of the battery pack and allows for consistent warranty calculations regardless of the capacity of the battery pack. The C-rate may then be mapped to current factors for use in warranty calculations. For example, a normalized C-rate of 1 C may be mapped to a current factor of 2, whereas a C-rate of 3 C may be mapped to a current factor of 10, indicating a higher rate of charge or discharge. In an embodiment, separate sets of mappings may be maintained for charge and discharge rates. In an embodiment, these mappings may be stored in a lookup table residing in a computer readable storage device within the battery pack. In another embodiment, mappings and current factors may be stored in a computer-readable storage device that is external to the battery pack. Alternatively, in an embodiment, a predefined mathematical function may be applied to C-rates or electric current measurements to produce a corresponding current factor, rather than explicitly storing mappings and current factors.

In an embodiment, calculated C-rates above a maximum C-rate warranty threshold 608 may immediately void the warranty on the battery pack. This threshold may be predefined or set dynamically by the warranty tracker. In a non-limiting example, maximum warranty threshold 608 may be set to a C-rate of 2 C. Calculated C-rates above maximum warranty threshold 608 may indicate improper usage of the battery pack, and hence the warranty may not cover subsequent issues that arise. In an embodiment, maximum warranty thresholds may be defined for both the rate of charge and discharge of the battery pack, rather than maintaining a single threshold for both charge and discharge.

Temperature is another factor that may affect battery performance. In general, higher temperatures may cause the battery pack to age at a faster rate by generating higher internal temperatures, which causes increased stress on the battery pack. This may shorten the life of a battery pack. On the other hand, lower temperatures may, for example, cause damage when the battery pack is charged.

Figure 7:
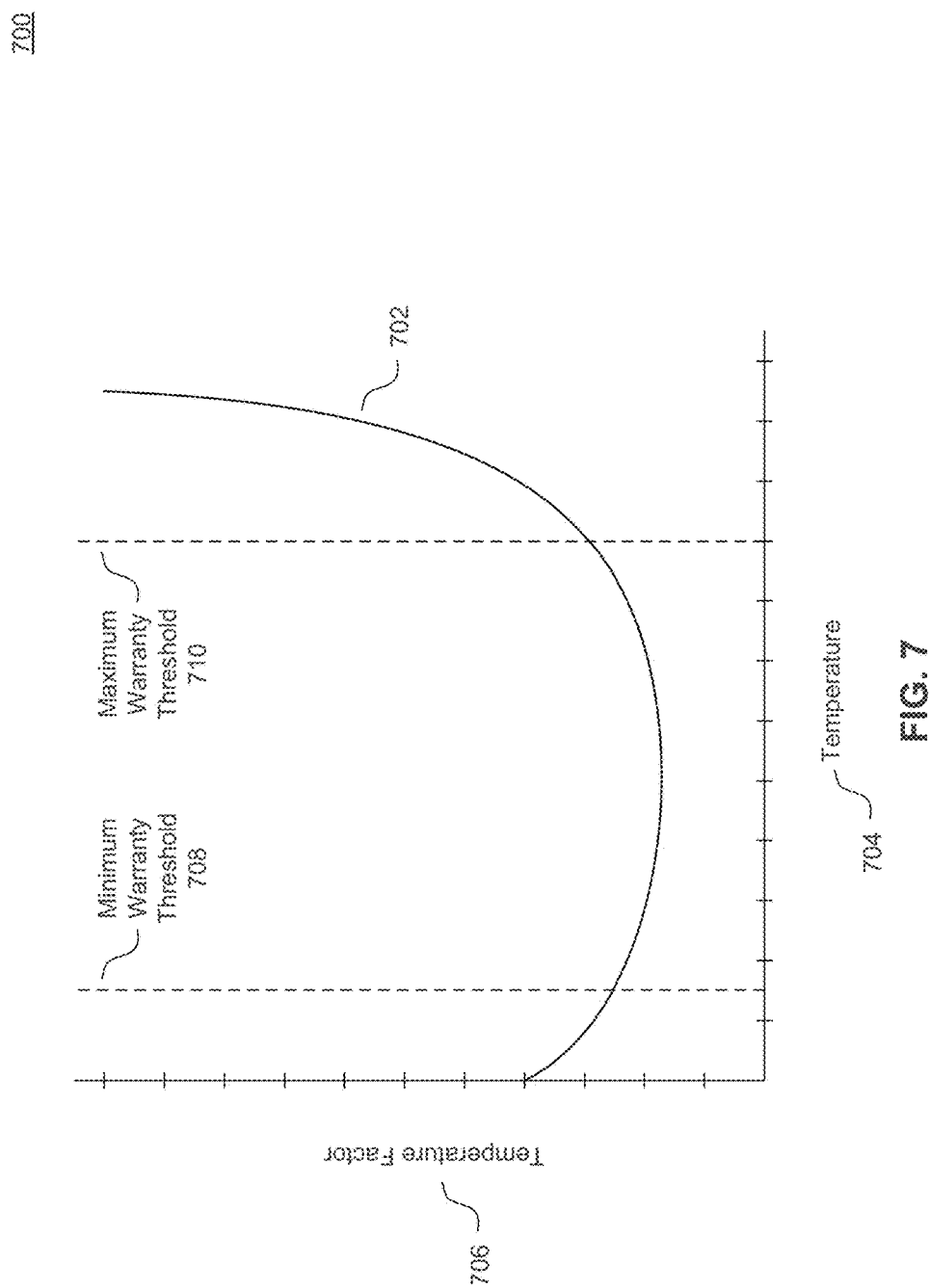
FIG. 7 is a diagram illustrating a correlation between a temperature measurement and a temperature factor used in the calculation of a warranty value, according to an embodiment.

FIG. 7 is a diagram illustrating an example correlation between a temperature measurement and a temperature factor used in the calculation of a warranty value according to an embodiment. A battery pack, such as battery pack 100 of FIGS. 1A-C, may include one or more battery temperature measurement circuits that measures the temperature of the individual battery cells or the individual battery modules within the battery pack. In another embodiment, the temperature measurement circuit may be external to the battery pack. Example plot 702 illustrates temperature factor 706 as a function of measured temperature 704, according to an embodiment. Temperature measurements may be used to calculate warranty values by converting the measured temperature to a corresponding temperature factor. In an embodiment, temperature measurements may be mapped to temperature factors for use in warranty calculations. For example, a normal operating temperature of 20° C. may be mapped to a temperature factor of 1, whereas a higher temperature of 40° C. would be mapped to a higher temperature factor. A higher temperature factor may indicate that battery wear is occurring at a faster rate. In an embodiment, these mappings may be stored in a lookup table residing in a computer-readable memory device within the battery pack. In another embodiment, mappings and temperature factors may be stored in a computer readable memory device that is external to the battery pack. Alternatively, in an embodiment, a predefined mathematical function may be applied to temperature measurements to produce a corresponding temperature factor, rather than explicitly storing mappings and temperature factors.

Warranty thresholds may also be a function of battery temperature such as, for example, charging the battery pack when the temperature is below a predefined value. In an embodiment, operating temperatures below a minimum temperature warranty threshold 708 or above a maximum temperature warranty threshold 710 may immediately void the warranty on the battery pack. These thresholds may be predefined or set dynamically by the warranty tracker. Operating temperatures below minimum warranty threshold 708 or above maximum warranty threshold 710 may indicate improper usage of the battery pack, and hence the warranty may not cover subsequent operating issues or defects that arise. In an embodiment, minimum and maximum warranty thresholds may be defined for both charging and discharging the battery pack rather than maintaining the same thresholds for both charging and discharging.

Voltage and/or state-of-charge are additional factors that may affect battery performance. The voltage of a battery pack, which may be measured, may be used to calculate or otherwise determine the state-of-charge of the battery pack, in general, very high or very low states of charge or voltages cause increased stress on the battery pack. This, again, may shorten the life of the battery pack.

Figure 8:
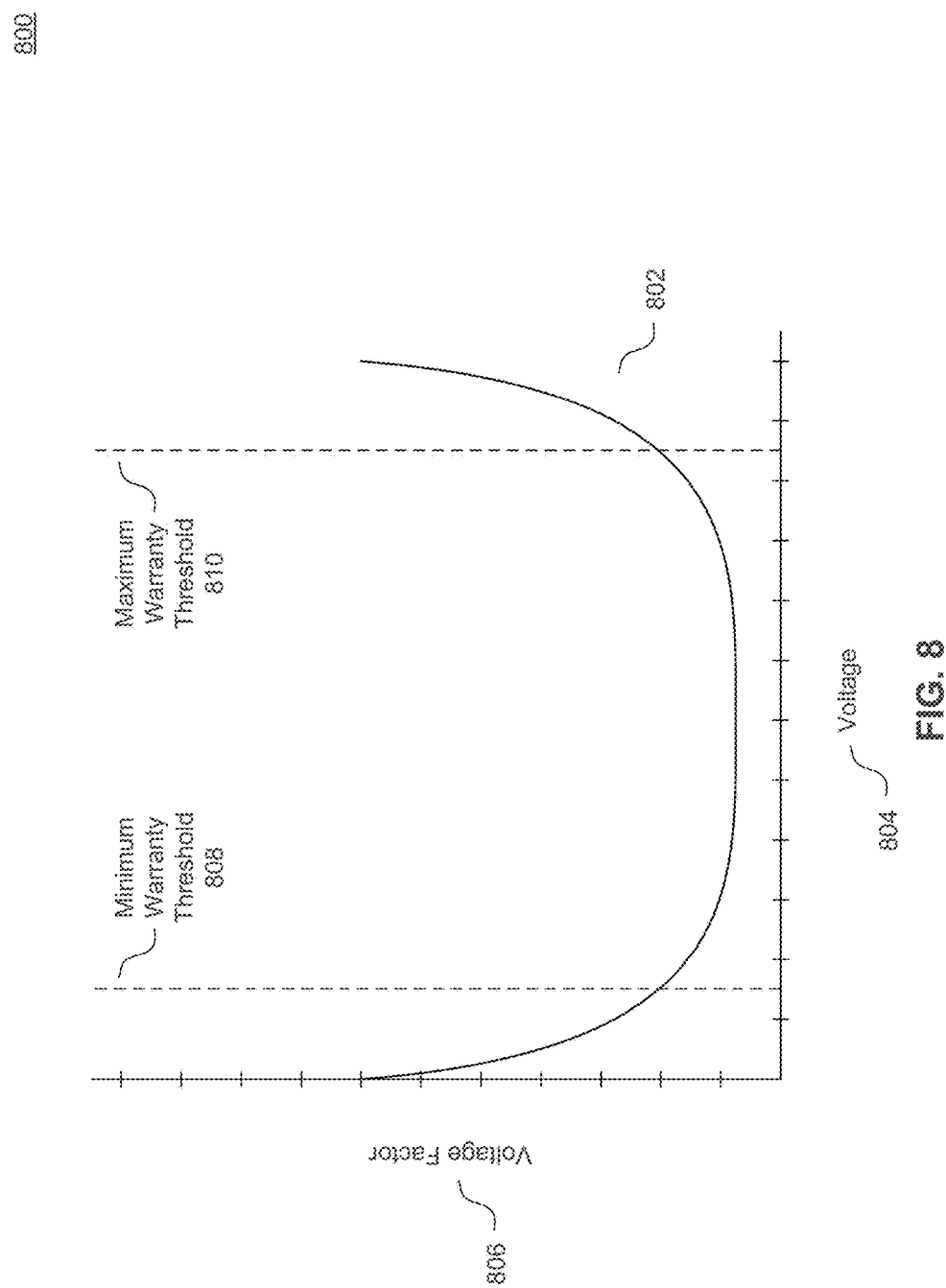
FIG. 8 is a diagram illustrating a correlation between a voltage measurement and a voltage factor used in the calculation of a warranty value, according to an embodiment.

FIG. 8 is a diagram illustrating an example correlation between a voltage measurement and a voltage factor used in the calculation of a warranty value according to an embodiment. A battery pack, such as battery pack 100 of FIGS. 1A-C, may include a battery voltage measurement circuit that measures the voltage of individual battery cells or the voltage of battery modules within the battery pack. In another embodiment, the voltage measurement circuit may be external to the battery pack. These voltage measurements may be aggregated or averaged for use in calculating warranty values for the battery pack. In an embodiment, the state-of-charge of the battery pack may be calculated and used in the calculation of a warranty value; however, this calculation is not always accurate and so care must be taken in determining a warranty calculation factor. In an embodiment, the measured voltage of the battery pack may be the average measured voltage of each battery cell or each battery module contained within the battery pack.

In FIG. 8, example plot 802 illustrates voltage factor 806 as a function of measured voltage 804, according to an embodiment. Voltage measurements may be used to calculate warranty values by converting the measured voltage to a corresponding voltage factor. In an embodiment, voltage measurements may be mapped to voltage factors for use in warranty calculations. These mappings may be specific to the type of battery cells contained in the battery pack. For example, a battery pack including one or more lithium-ion battery cells may have a nominal open-circuit voltage of 3.2V for each cell, in this case, a voltage measurement of 3.2V may be mapped to a voltage factor of 1. In contrast, a voltage measurement of 3.6V or 2.8V at a certain charge or discharge rate may be mapped to a higher voltage factor, indicating a higher or lower state-of-charge. In an embodiment, these mappings may be stored in a lookup table residing in a computer-readable memory device within the battery pack. In another embodiment, mappings and voltage factors may be stored in a computer-readable memory device external to the battery pack. Alternatively, in an embodiment, a predefined mathematical function may be applied to voltage measurements to produce a corresponding voltage factor, rather than explicitly storing mappings and voltage factors.

In an embodiment, measured voltages below a minimum voltage warranty threshold 808 or above a maximum voltage warranty threshold 810 may immediately void the warranty on the battery pack. These thresholds may be predefined or set dynamically by the warranty tracker. In a non-limiting example, minimum and maximum warranty thresholds 808 and 810 may be set to voltages indicating the over-discharging and over-charging of the battery cells, respectively. Measured voltages below minimum warranty threshold 808 or above maximum warranty threshold 810 may indicate improper usage of the battery pack, and hence the warranty may not cover subsequent issues that arise.

Figure 9:
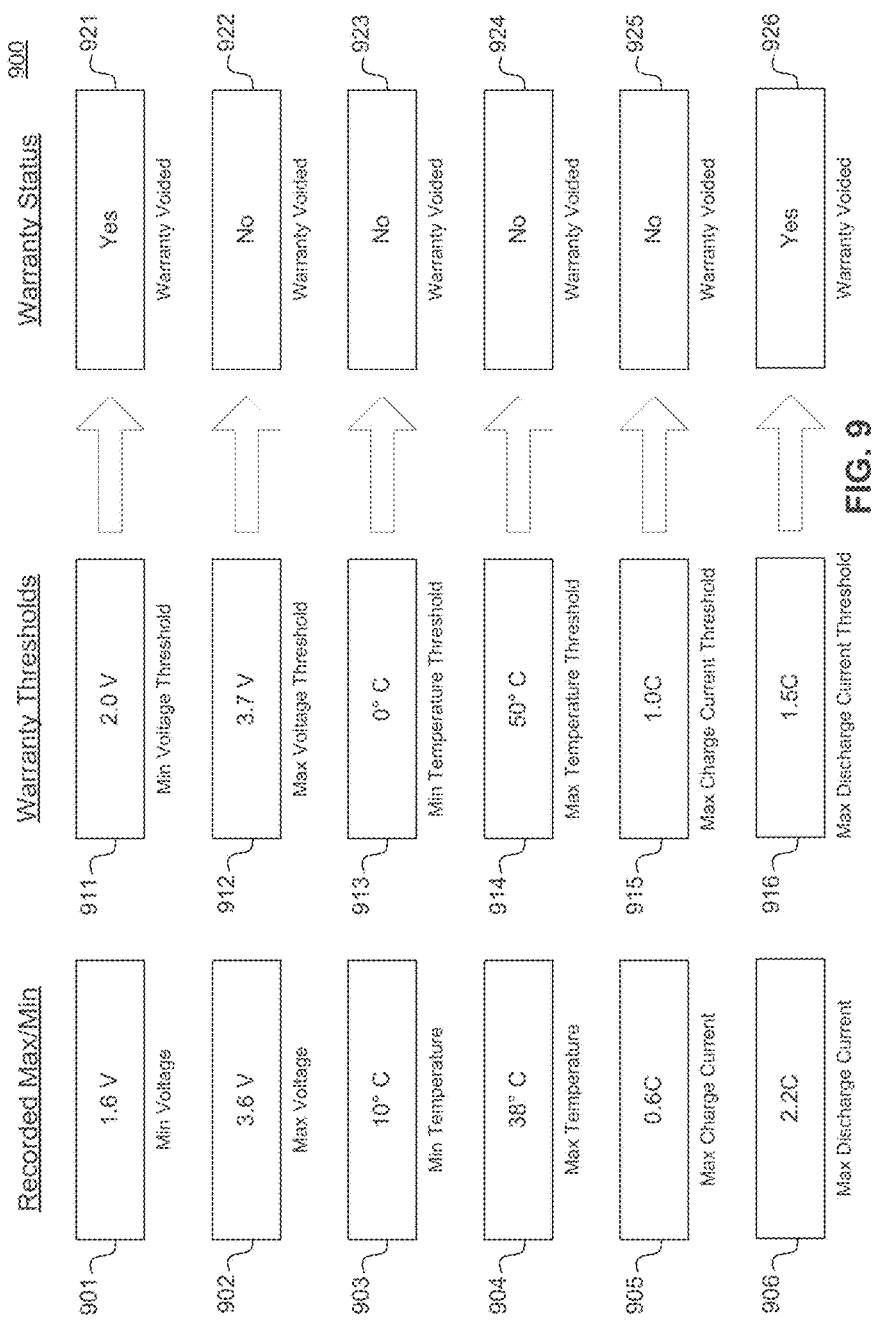
FIG. 9 is a diagram illustrating warranty thresholds used for voiding a warranty for a battery pack, according to an embodiment.

FIG. 9 is a diagram illustrating example warranty thresholds used for voiding a warranty for a battery pack according to an embodiment. As previously described, improper usage of a battery pack may cause a warranty to be automatically voided. For example, extreme operating temperatures, voltages, or charge/discharge rates may immediately void a warranty.

In various embodiments, a battery pack may store the minimum recorded voltage 901, maximum recorded voltage 902, minimum recorded temperature 903, maximum recorded temperature 904, maximum recorded charging electric current 905, and maximum recorded discharging electric current 906 for the life of the battery pack. These values may be recorded by any device or combination of devices capable of measuring or calculating the aforementioned data, such as (but not limited to) one or more battery voltage measurement circuit(s), battery temperature measurement circuit(s), and electric current measurement circuit(s), respectively, which are further described with respect to FIGS. 8-9. In an alternate embodiment, the battery pack may store in a computer-readable memory device a maximum recorded electric current, rather than both a maximum charging and discharging electric current. In an embodiment, data measurements may be recorded in a computer-readable memory device periodically during the life of the battery. For minimum values 901 and 903, if a newly recorded value is less than the stored minimum value, the previously stored minimum value is overwritten with the newly recorded value. For maximum values 902, 904, 905, and 906, if a newly recorded value is greater than the stored maximum value, the previously stored maximum value is overwritten with the newly recorded value.

In an embodiment, each battery pack may maintain a list of warranty threshold values, for example warranty threshold values 911-916, in a computer-readable storage device. In another embodiment, the list of warranty threshold values may be maintained in a computer-readable storage device that is external to the battery pack. Warranty threshold values may indicate minimum and maximum limits used to determine uses of the battery pack that are outside the warranty coverage. The warranty tracker may periodically compare the stored minimum and maximum values 901-906 to warranty threshold values 911-916 to determine whether a warranty for the battery pack should be voided.

In an embodiment, the battery pack may store a warranty status in a computer-readable storage device. The warranty status may be any type of data capable of representing a status. For example, the warranty status may be a binary flag that indicates whether the warranty has been voided. The warranty status may also be, for example, an enumerated type having a set of possible values, such as but not limited to, active, expired, and void.

As illustrated in FIG. 9, the warranty status is set based on a comparison of the recorded maximum and minimum values 901-906 to predefined warranty thresholds 911-916. For example, minimum recorded voltage 901 is 1.6 V and minimum voltage threshold 911 is 2.0 V. In this example, minimum recorded voltage 901 is less than minimum voltage threshold 911, and therefore the warranty is voided, as indicated at box 921. This will be reflected in the warranty status and stored. In various embodiments, when the warranty is voided, an electronic communication may be generated and sent by the battery pack and/or system in which the battery pack is used to notify selected individuals that the warranty has been voided. The electronic communication may also include details regarding the conditions or use that caused the warranty to be voided.

Figure 10:
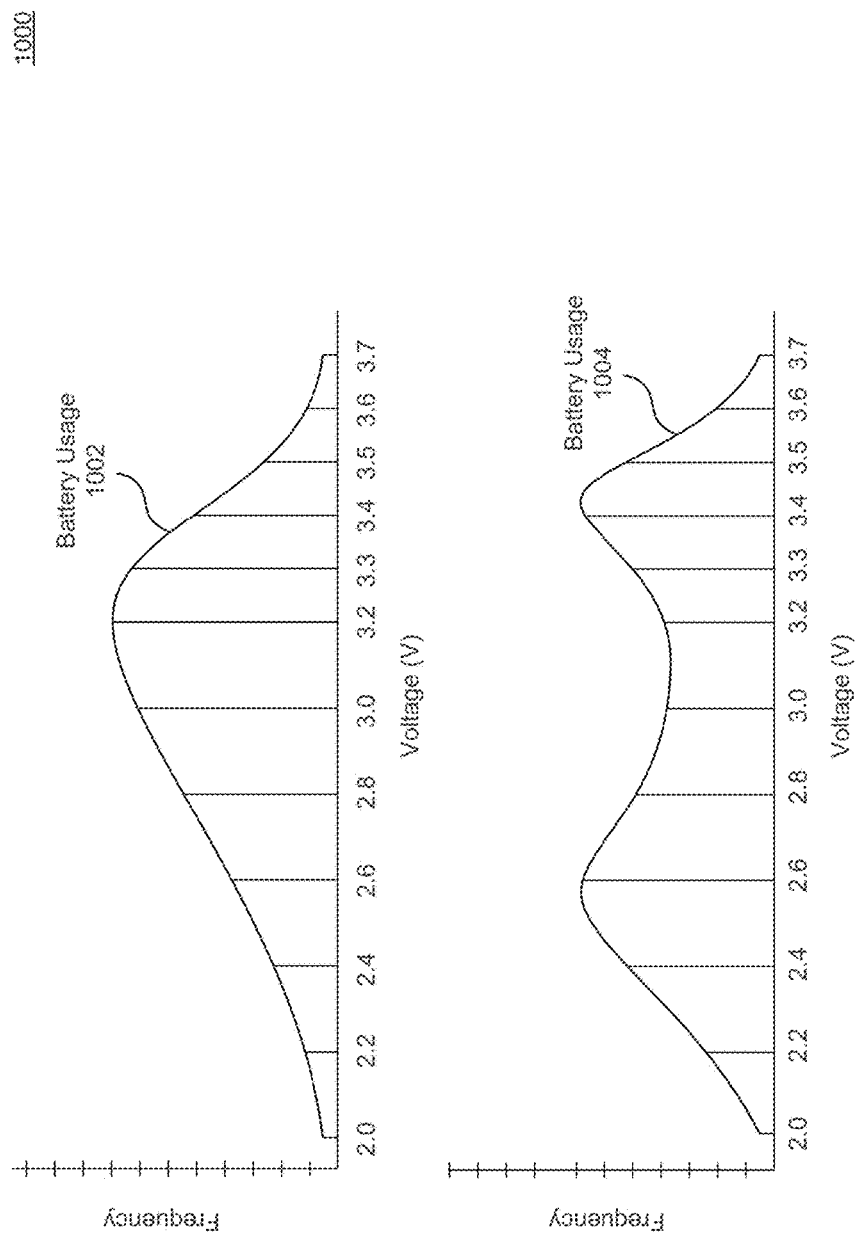
FIG. 10 is a diagram illustrating example usage of a battery pack, according to an embodiment.

FIG. 10 is a diagram illustrating example usage of a battery pack according to an embodiment. In addition to minimum and maximum data values being recorded, as described with respect to FIG. 9, usage frequency statistics may also be collected. For example, usage statistics may be recorded based on battery voltage measurements, battery temperature measurements, and charge/discharge current measurements.

In an embodiment, one or more ranges of values may be defined for each type of recorded data. In the example illustrated in FIG. 10, defined ranges for measured voltage are 2.0 V-2.2 V, 2.2 V-2.4 V, 2.4 V-2.6 V, 2.6 V-2.8 V, 2.8 V-3.0 V, 3.0 V-3.2 V, 3.2 V-3.3 V, 3.3 V-3.4 V, 3.4 V-3.5 V, 3.5 V to 3.6 V, and 3.6 V-3.7 V. These ranges may be common for lithium-ion batteries, for example, in order to capture typical voltages associated with such batteries. Each defined range may be associated with a counter. In an embodiment, each counter is stored in a computer-readable storage device within a battery pack. In other embodiments, counters may be stored external to a battery pack, for example in a string controller or a system controller of an electrical storage unit, as described with respect to FIG. 5. This may allow for further aggregation of usage statistics across multiple battery packs.

In an embodiment, voltage measurements may be taken periodically. When a measured value falls within a defined range, the associated counter may be incremented. The value of each counter then represents the frequency of measurements falling within the associated range of values. Frequency statistics may then be used to create a histogram displaying the distribution of usage measurements for the life of a battery pack, or during a period of time. Likewise, frequency statistics may be recorded for other measured or calculated data, such as but not limited to, battery temperature measurements and charge/discharge current measurements.

For example, battery usage 1002 represents the distribution of voltage measurements taken during the life of a battery pack. Battery usage 1002 may indicate ordinary or proper usage of a battery pack, having the highest frequency of measurements between 3.0 V and 3.2 V. In contrast, battery usage 1004 may indicate more unfavorable usage.

Histograms, such as those displayed in FIG. 10, may be useful to a manufacturer or setter in determining the extent of improper or uncovered usage of a battery pack. In an embodiment, the distribution data may also be used for analysis and diagnosis of battery pack defects and warranty claims.

Figure 11:
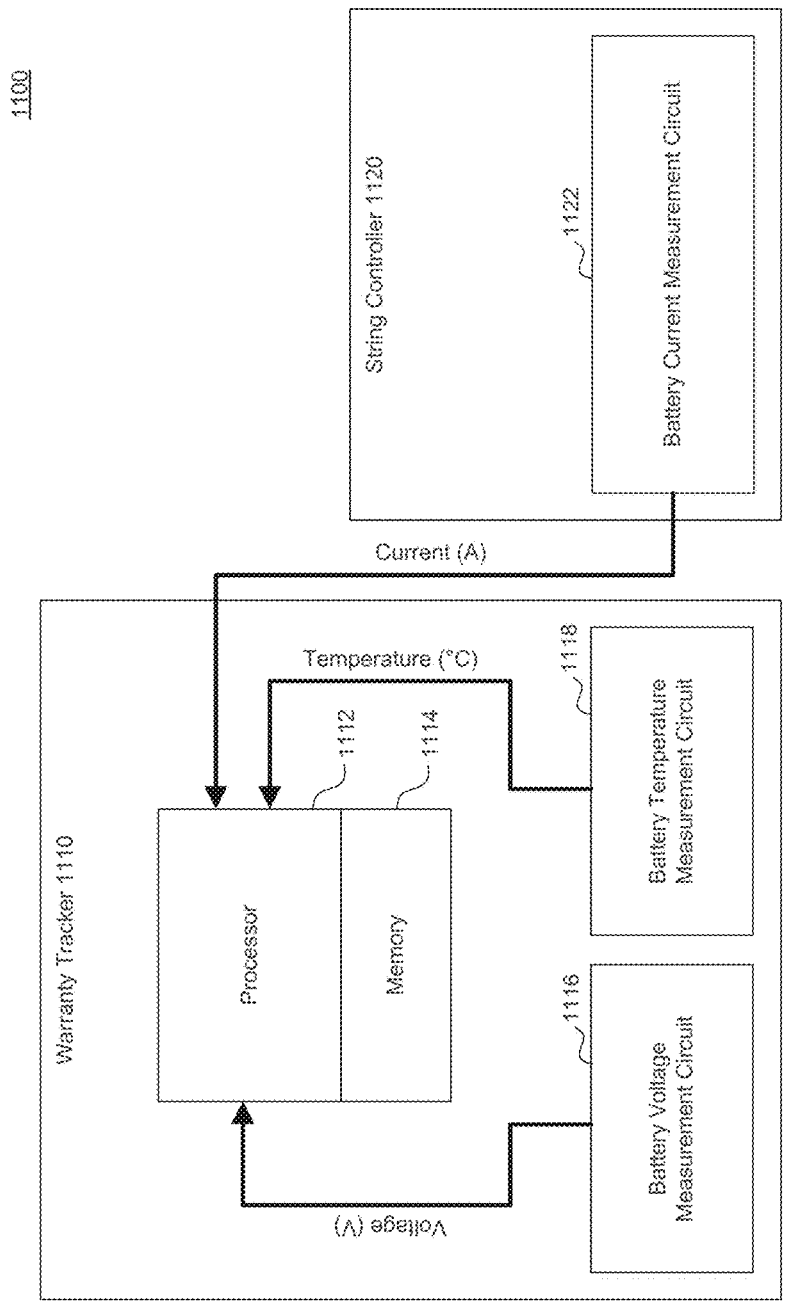
FIG. 11 is a diagram illustrating an example warranty tracker according to an embodiment.

FIG. 11 is a diagram illustrating an example warranty tracker according to an embodiment. Warranty tracker 1110 includes a processor 1112, a memory 1114, a battery voltage measurement circuit 1116, and a battery temperature measurement circuit 1118. The battery voltage measurement circuit 1116 and the battery temperature measurement circuit 1118 may be implemented as a single circuit or as separate circuits disposed on a printed circuit board. In some embodiments, such as those detailed above with respect to FIGS. 2 and 4, each battery module disposed in a battery pack may be coupled to a battery module controller that includes a battery voltage measurement circuitry as well as battery temperature measurement circuitry. In these embodiments, the processor 1112 and memory 1114 of example warranty tracker 1110 may part of or implemented within a battery pack controller, such as battery pack controller 300 of FIG. 3. Thus, warranty tracker 1110 may be part of or implemented within a distributed battery management system, such as described with respect to FIG. 5.

In various embodiments, voltage may be measured as an aggregate voltage or average voltage of the battery cells or battery modules contained within the battery pack. Battery temperature measurement circuit 1118 may include one or more temperature sensors to periodically measure battery cell temperatures or battery module temperatures within the battery pack and send an aggregate or average temperature measurement to processor 1112.

In an embodiment, processor 1112 also receives periodic electric current measurements from battery current measurement circuit 1122. Battery current measurement circuit 1122 may be external to warranty tracker 1110. For example, battery current measurement circuit 1122 may reside with string controller 1120. String controller 1120 may be part of an electrical storage unit, as described with respect to FIG. 5, and may control a subset of battery packs. In another embodiment, battery current measurement circuit 1122 may be part of warranty tracker 1110.

Processor 1112 may compute warranty values based on received voltage, temperature, and electric current measurements. In an embodiment, each warranty value represents battery usage at the time the received measurements were recorded. Once received, measurements may be converted to associated factors for use in calculating a warranty value. For example, a voltage measurement received from battery voltage measurement circuit 1116 may be converted to a corresponding voltage factor as described with respect to FIG. 8. Similarly, received temperature measurements and electric current measurements may be converted to corresponding temperature and current factors as described with respect to FIGS. 6 and 7.

In an embodiment, processor 1112 may calculate a warranty value by multiplying the voltage factor, temperature factor, and current factor together. For example, the current factor may be 0 when a battery pack is neither charging nor discharging. The calculated warranty value will therefore also be 0, indicating that no usage is occurring. In another example, when battery temperature and voltage are at optimal levels, the corresponding temperature and voltage factors may be 1. The calculated warranty value will then be equal to the current factor corresponding to the measured electric current. When all factors are greater than zero, the warranty value indicates battery usage based on each of the voltage, temperature, and electric current measurements.

As described previously, additional measured or calculated data may also be used in the calculation of a warranty value. A warranty value may also be calculated based on any combination voltage, temperature, and current factors, according to an embodiment.

White a warranty value represents battery usage at a point in time, a warranty for a battery pack is based on battery usage for the life of the battery pack. (which may be defined by the manufacturer of the battery pack). In an embodiment, memory 1114 stores a cumulative warranty value that represents battery usage over the life of the battery pack. Each time a warranty value is calculated, processor 1112 may add the warranty value to the cumulative warranty value stored in memory 1114. The cumulative warranty value may then be used to determine whether the battery pack warranty is active or expired.

Figure 12:
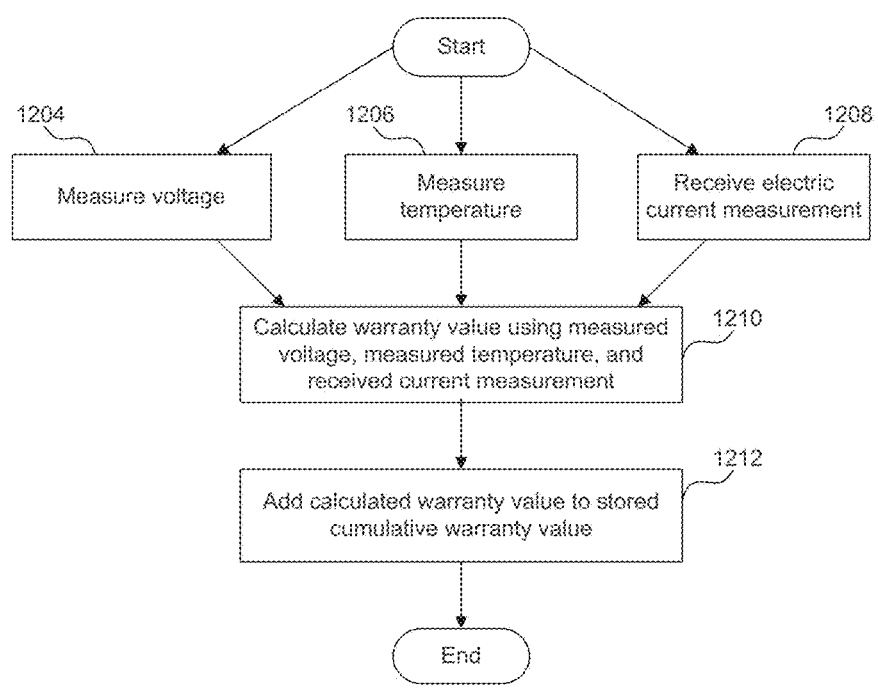
FIG. 12 is an example method for calculating and storing a cumulative warranty value, according to an embodiment.

FIG. 12 is an example method for calculating and storing a cumulative warranty value according to an embodiment. Each stage of the example method may represent a computer-readable instruction stored on a computer-readable storage device, which when executed by a processor causes the processor to perform one or more operations.

Method 1200 begins at stage 1204 by measuring battery cell voltages within a battery pack. In an embodiment, battery cell voltage measurements for different battery cells or battery modules may be aggregated or averaged across a battery pack. At stage 1206, battery cell temperatures may be measured. In an embodiment, battery cell temperature measurements for different battery cells or battery modules may be aggregated or averaged across a battery pack. At stage 1208, an electric charge/discharge current measurement may be received. Stages 1204, 1206, and 1208 may be performed concurrently or in any order.

At stage 1210, a warranty value is calculated using the measured battery voltage, measured battery temperature, and received electric current measurement. In an embodiment, each warranty value represents battery usage at the time the measurements were recorded. Once received, measurements may be converted to associated factors for use in calculating a warranty value. For example, a voltage measurement may be converted to a corresponding voltage factor as described with respect to FIG. 8. Similarly, temperature measurements and received electric current measurements may be converted to corresponding temperature and current factors as described with respect to FIGS. 6 and 7.

In an embodiment, a warranty value may be calculated by multiplying the voltage factor, temperature factor, and current factor together. For example, the current factor may be 0 when a battery pack is neither charging nor discharging. The calculated warranty value will therefore also be 0, indicating that no usage is occurring. In another example, when battery temperature and voltage are at optimal levels, the corresponding temperature and voltage factors may be 1. The calculated warranty value will then be equal to the current factor corresponding to the measured electric current. When all factors are greater than zero, the warranty value indicates battery usage based on each of the voltage, temperature, and electric current measurements.

As described previously, additional measured or calculated data may also be used in the calculation of a warranty value. A warranty value may also be calculated based on any combination voltage, temperature, and current factors, according to an embodiment.

At stage 1212, the calculated warranty value is added to a stored cumulative warranty value. In an embodiment the cumulative warranty value may be stored within the battery pack. In other embodiments, the cumulative warranty value may be stored external to the battery pack. The cumulative warranty value may then be used to determine whether the battery pack warranty is active or expired, as will be discussed further with respect to FIGS. 13 and 14.

Figure 13:
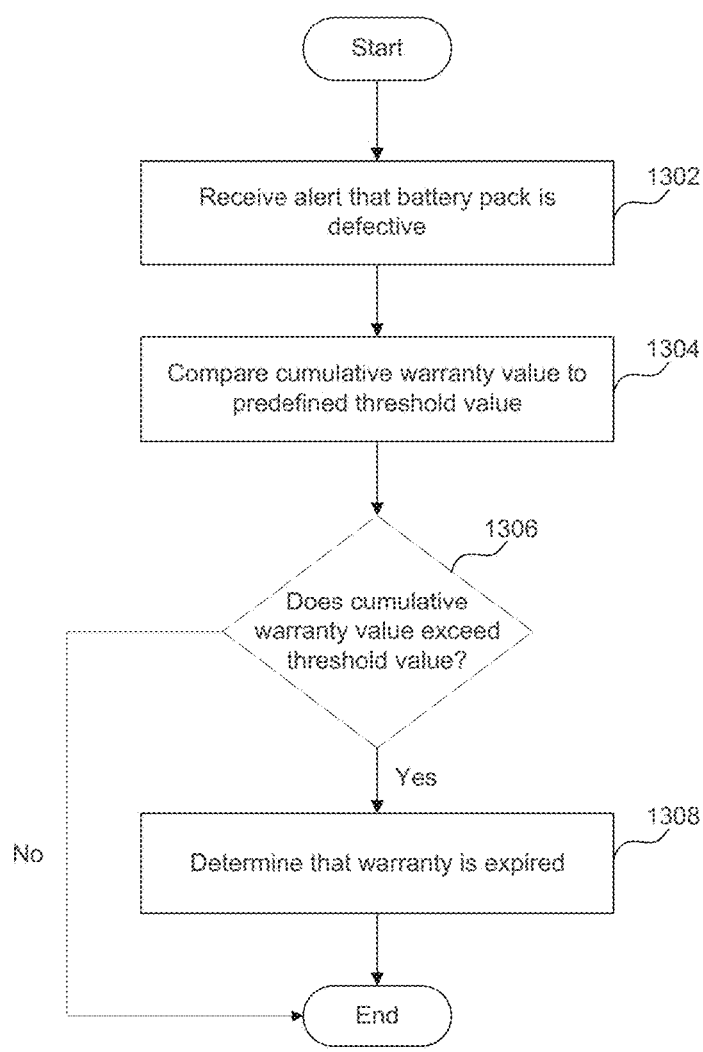
FIG. 13 is an example method for using a warranty tracker, according to an embodiment.

FIG. 13 is an example method for using a warranty tracker according to an embodiment. FIG. 13 begins at stage 1302 when a warning or alert is received indicating that a battery pack has an operating issue or is otherwise defective. In an embodiment, the alert may be issued as an email or other electronic communication to an operator responsible for monitoring the battery pack. In other embodiments, warnings or alerts may be audial or visual alerts, for example, a flashing red light on the defective battery pack, such as the warnings described above with respect to status button 108 of FIGS. 1A and 1B.

At stage 1304, the cumulative warranty value stored in the defective battery pack is compared to a predefined threshold value. This threshold value may be set to provide a certain warranty period based on normal usage of the battery pack. For example, the threshold may be set such that a battery pack may be covered under warranty for 110 years based on normal usage. In this manner, aggressive usage of the battery pack may reduce the active warranty period for the battery pack.

At stage 1306, it is determined whether the stored cumulative warranty value exceeds the predefined threshold value. If the stored cumulative value exceeds the predefined threshold value, method 1300 proceeds to stage 1308. At stage 1308, the warranty for the battery pack is determined to be expired. If the stored cumulative value does not exceed the threshold value, the method ends, indicating that the battery pack warranty has not expired.

FIG. 14 is a diagram illustrating an example battery pack and associated warranty information according to an embodiment. When a battery pack is reported to be defective, analysis of warranty information may be conducted. As illustrated in FIG. 14, battery pack 1404 resides in an electrical storage unit 1402, similar to that of electrical storage unit 500 of FIG. 5. In response to an alert that battery pack 1404 is defective, battery pack 1404 may be removed from electrical storage unit 1402 for analysis.

In an embodiment, battery pack 1404 may be connected to a computing device with display 1406. In this manner, the battery pack operator, seller, or manufacturer may be able to view various warranty information and status in order to determine which party is financially responsible for repairing battery pack 1404. In the example illustrated in FIG. 14, a warranty threshold value may be set to 500,000,000, and the cumulative warranty value of the battery pack is 500,000,049. Because the cumulative warranty value exceeds the warranty threshold, the battery pack warranty is determined to be expired, and the battery pack operator or owner should be financially responsible for repairs.

In an embodiment, warranty information for battery pack 1404 may be viewed without physically removing battery pack 1404 from electrical storage unit 1402. For example, stored warranty information may be sent via accessible networks to a device external to battery pack 1404 for analysis.

Embodiments of the present inventions have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed. Also, Identifiers, such as "(a)" "(b)," "(i)," "(ii)," etc., are sometimes used for different elements or steps. These identifiers are used for clarity and do not necessarily designate an order for the elements or steps.

The foregoing description of specific embodiments will so fully reveal the general nature of the inventions that others can, by applying knowledge within the skill of the art, readily modify and/or adapt for various applications such specific embodiments, without undue experimentation, without departing from the general concept of the present inventions. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light attic teachings and guidance.

The breadth and scope of the present inventions should not be limited by any of the above-described embodiments, but should be defined only in accordance with the following claims and their equivalents.

What is claimed is:

1. A battery pack, comprising:
   a plurality of battery modules, each battery module including a plurality of battery cells;
   a plurality of daisy-chained battery module controllers, each battery module controller mounted on a respective battery module of the plurality of battery modules;
   a battery pack controller coupled to the plurality of daisy-chained battery module controllers via a wire or cable to form a communication network;
   a memory device configured to store a cumulative warranty value representing cumulative battery usage of the battery pack; and
   a warranty tracker, implemented within the battery pack controller, configured to:

periodically receive at least one of a voltage measurement and a temperature measurement from each of the plurality of daisy-chained battery module controllers for the respective battery module of the plurality of battery modules, and an electric current measurement indicating a rate of charge or discharge of the battery pack;

normalize at least one of the voltage measurement and the temperature measurement from each of the plurality of daisy-chained battery module controllers based on a predefined conversion function to generate at least one of a voltage factor and a temperature factor for each of the plurality of daisy-chained battery module controllers;

calculate a new warranty value representing usage of the battery pack for a period of time using at least the voltage factor or the temperature factor for each of the plurality of daisy-chained battery module controllers; and add the new warranty value to the cumulative warranty value stored in the memory device.

2. The battery pack of claim 1, wherein each battery module controller further comprises a temperature sensor configured to measure a temperature of the respective battery module and to report the temperature measurement to the warranty tracker.

3. The battery pack of claim 1, wherein the warranty tracker is further configured to calculate the new warranty value using the received electric current measurement.

4. The battery pack of claim 1, wherein each battery module controller further comprises a voltage sensor configured to measure a voltage of the respective battery module and to report the voltage measurement to the warranty tracker.

5. The battery pack of claim 1, wherein the warranty tracker and the memory device are disposed on a printed circuit board that is embedded within the battery pack.

6. A method for providing warranty tracking for a battery pack, the battery pack including a plurality of battery modules each containing a plurality of battery cells, a plurality of daisy-chained battery module controllers each mounted on a respective battery module of the plurality of battery modules, a battery pack controller coupled to the plurality of daisy-chained battery module controllers via a wire or cable to form a communication network, and a warranty tracker implemented within the battery pack controller, the method comprising:

periodically receiving, by the warranty tracker, at least one of a voltage measurement and a temperature measurement from each of the plurality of daisy-chained battery module controllers of the battery pack, and an electric current measurement indicating a rate of charge or discharge of the battery pack;

normalizing at least one of the voltage measurement and the temperature measurement from each of the plurality of daisy-chained battery module controllers based on a predefined conversion function to generate at least one of a voltage factor and a temperature factor for each of the plurality of daisy-chained battery module controllers;

calculating, by the warranty tracker, a warranty value representing usage of the battery pack for a period of time using at least the voltage factor or the temperature factor for each of the plurality of daisy-chained battery module controllers, and adding, by the warranty tracker, the calculated warranty value to a cumulative warranty value stored in a memory device of the battery pack, the cumulative warranty value representing cumulative battery usage of the battery pack.

7. The method of claim 6, further comprising measuring, by each of the plurality of battery module controllers, a temperature of the respective battery module.

8. The method of claim 7, further comprising storing a maximum and a minimum temperature measurement for the battery pack, wherein the maximum and the minimum temperature measurement are determined based on the temperature measurements received from each of the plurality of daisy-chained battery module controllers of the battery pack.

9. The method of claim 6, further comprising measuring, by each of the plurality of battery module controllers, a voltage of the respective battery module.

10. The method of claim 9, further comprising storing a maximum and a minimum voltage measurement for the battery pack, wherein the maximum and the minimum voltage measurement are determined based on the voltage measurements received from each of the plurality of daisy-chained battery module controllers of the battery pack.

11. The method of claim 6, further comprising calculating the warranty value using the received electric current measurement.

12. The method of claim 6, further comprising storing a maximum electric current measurement for the battery pack, wherein the maximum electric current measurement is determined based on the electric current measurements received from each of the plurality of daisy-chained battery module controllers of the battery pack.

* * * * *